(12) United States Patent
Cai

(10) Patent No.: US 12,345,783 B2
(45) Date of Patent: Jul. 1, 2025

(54) MAGNETIC SENSOR DEVICE AND MAGNETIC ENCODER

(71) Applicant: TDK CORPORATION, Tokyo (JP)

(72) Inventor: Yongfu Cai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 189 days.

(21) Appl. No.: 18/347,768

(22) Filed: Jul. 6, 2023

(65) Prior Publication Data

US 2024/0019507 A1     Jan. 18, 2024

(30) Foreign Application Priority Data

Jul. 13, 2022   (JP) .................................. 2022-112420

(51) Int. Cl.
     *G01R 33/09*      (2006.01)
     *G01D 5/14*      (2006.01)

(52) U.S. Cl.
     CPC ........... *G01R 33/091* (2013.01); *G01D 5/142* (2013.01)

(58) Field of Classification Search
     CPC .... G01R 33/091; G01R 33/09; G01R 33/093; G01R 33/098; G01R 33/063; G01R 33/10; G01D 5/142; G01D 5/145
See application file for complete search history.

(56) References Cited

U.S. PATENT DOCUMENTS

| | | | |
|---|---|---|---|
| 9,903,920 B2 * | 2/2018 | Grimm | G01R 33/096 |
| 2019/0235032 A1 * | 8/2019 | Lassalle-Balier | G01R 33/093 |
| 2019/0301894 A1 * | 10/2019 | Uchida | G01D 5/145 |
| 2020/0116801 A1 * | 4/2020 | Watanabe | G01R 33/07 |
| 2021/0096196 A1 * | 4/2021 | Cai | G01R 33/0076 |

FOREIGN PATENT DOCUMENTS

| | | | |
|---|---|---|---|
| JP | 2005-123383 A | | 5/2005 |
| JP | 2008-016716 A | | 1/2008 |
| JP | 2010-281767 A | | 12/2010 |

* cited by examiner

*Primary Examiner* — Alvaro E Fortich
(74) *Attorney, Agent, or Firm* — Oliff PLC

(57) ABSTRACT

A magnetic sensor device includes a magnetic sensor, a die pad, and four leads. The magnetic sensor includes a bridge circuit including a plurality of arms and a plurality of pads electrically connected to the bridge circuit. One of the plurality of arms is provided between one of the plurality of pads and a different one of the plurality of pads in circuit configuration. The magnetic sensor further includes a sub-pad electrically connected between one end and another end of the one arm and also electrically connected to the die pad.

20 Claims, 17 Drawing Sheets

MAGNETIC SENSOR DEVICE AND MAGNETIC ENCODER

CROSS REFERENCE TO RELATED APPLICATIONS

This application claims the benefit of Japanese Priority Patent Application No. 2022-112420 filed on Jul. 13, 2022, the entire contents of which are incorporated herein by reference.

BACKGROUND

The technology relates to a magnetic sensor device and a magnetic encoder.

A magnetic encoder using a magnetic sensor is used to detect a position of a movable object whose position changes in a predetermined direction. The predetermined direction is a linear direction or a rotational direction. The magnetic encoder used to detect the position of the movable object is configured such that the position of a magnetic field generator, such as a magnetic scale, relative to the magnetic sensor changes within a predetermined range depending on the change in the position of the movable object.

As the position of the magnetic field generator relative to the magnetic sensor changes, the strength of a component of a target magnetic field, which is generated by the magnetic field generator and applied to the magnetic sensor, in one direction changes. For example, the magnetic sensor detects the strength of the component of the target magnetic field in one direction, and generates two detection signals that correspond to the strength of the component in the one direction and have respective different phases. The magnetic encoder generates a detection value having a correspondence with the position of the magnetic field generator relative to the magnetic sensor on the basis of the two detection signals.

A magnetic sensor including a plurality of magnetoresistive elements is used as the magnetic sensor for the magnetic encoder. For example, JP 2010-281767 A1 discloses a magnetic sensor in which a plurality of giant magnetoresistive (GMR) elements are arranged as the magnetoresistive elements in a direction of relative movement between a magnet and the magnetic sensor and a direction orthogonal to the direction of relative movement. This magnetic sensor includes a circuit in which a first magnetoresistive element and a second magnetoresistive element including respective pin layers magnetized in directions opposite to each other are connected in series.

In general, a magnetic encoder is completed by combining a magnetic sensor and a magnetic field generator manufactured separately. To prevent a decrease in manufacturing yield due to an inferior magnetic sensor being included in a magnetic encoder, it is preferable, at the time of manufacturing magnetic encoders, to inspect a magnetic sensor before an assembly step of combining the magnetic sensor with a magnetic field generator. An example of a method of inspecting a magnetic sensor is a method of applying a magnetic field for inspection to a magnetic sensor to measure an output of the magnetic sensor. An example of an apparatus that applies the magnetic field for inspection to the magnetic sensor is an apparatus configured to apply a uniform magnetic field to the entire magnetic sensor.

When a uniform magnetic field is applied to a magnetic sensor including a circuit in which two magnetoresistive elements magnetized in directions opposite to each other are connected in series as in the magnetic sensor disclosed in JP 2010-281767, the resistance of the circuit does not change, and the output of the magnetic sensor does not change either. Hence, such a magnetic encoder using a magnetic sensor including a circuit without sensitivity to a uniform external magnetic field cannot inspect a magnetic sensor by using a uniform magnetic field for inspection before an assembly step.

SUMMARY

A magnetic sensor device according to one embodiment of the technology includes: a magnetic sensor configured to detect a target magnetic field including a magnetic field component in a first direction; a die pad supporting the magnetic sensor; and a plurality of leads. The magnetic sensor includes a bridge circuit including a plurality of arms and a plurality of pads electrically connected to the bridge circuit, the plurality of arms being each constituted of a plurality of magnetic detection elements and configured such that a resistance changes according to change of strength of the magnetic field component. Each of the plurality of arms is configured to have sensitivity to the magnetic field component with strength changing according to a position in the first direction while not having sensitivity to an external magnetic field with strength and a direction being the same irrespective of the position in the first direction.

Each of the plurality of pads is electrically connected to one corresponding lead among the plurality of leads. The plurality of pads include a first pad, a second pad, and a third pad. The plurality of arms include a first arm provided between the first pad and the second pad in circuit configuration and a second arm provided between the second pad and the third pad in circuit configuration. The magnetic sensor further includes a first sub-pad electrically connected between one end and another end of the first arm and electrically connected to the die pad.

A magnetic encoder according to one embodiment of the technology includes: the magnetic sensor device according to one embodiment of the technology; and a magnetic field generator configured to generate the target magnetic field. The magnetic sensor and the magnetic field generator are configured such that the strength of the magnetic field component in a reference position changes when at least one of the magnetic sensor and the magnetic field generator operates.

In the magnetic sensor device and the magnetic encoder according to one embodiment of the technology, the magnetic sensor includes a first sub-pad electrically connected between one end and another end of the first arm and also electrically connected to the die pad. In this way, according to one embodiment of the technology, a magnetic sensor can be inspected by using a uniform external magnetic field.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
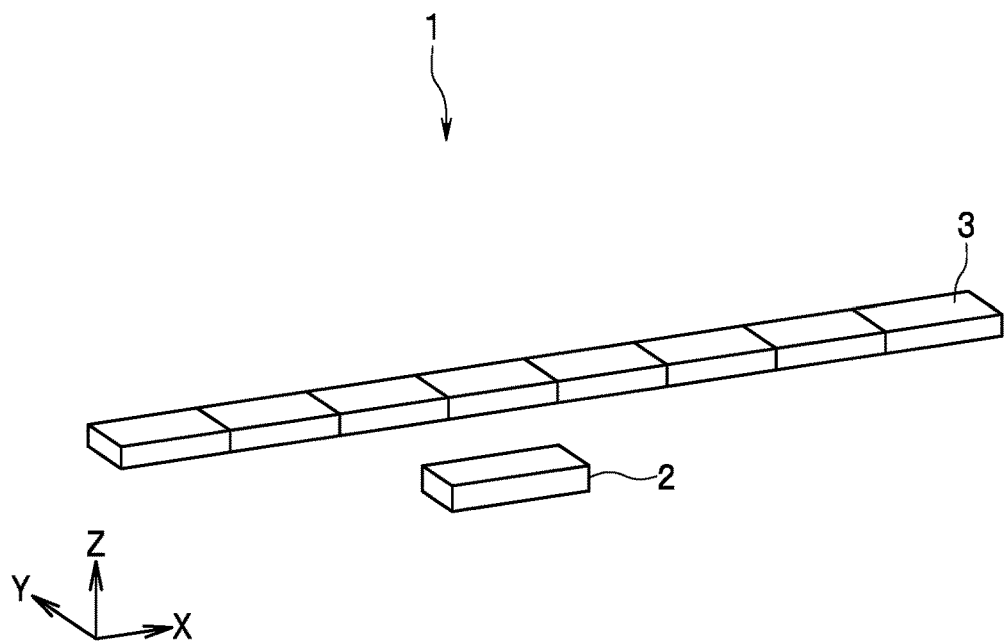
FIG. 1 is a perspective view showing a magnetic encoder according to a first example embodiment of the technology.

An object of the technology is to provide a magnetic sensor device and a magnetic encoder capable of inspecting a magnetic sensor by using a uniform external magnetic field even when the magnetic sensor includes a circuit without sensitivity to a uniform external magnetic field.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
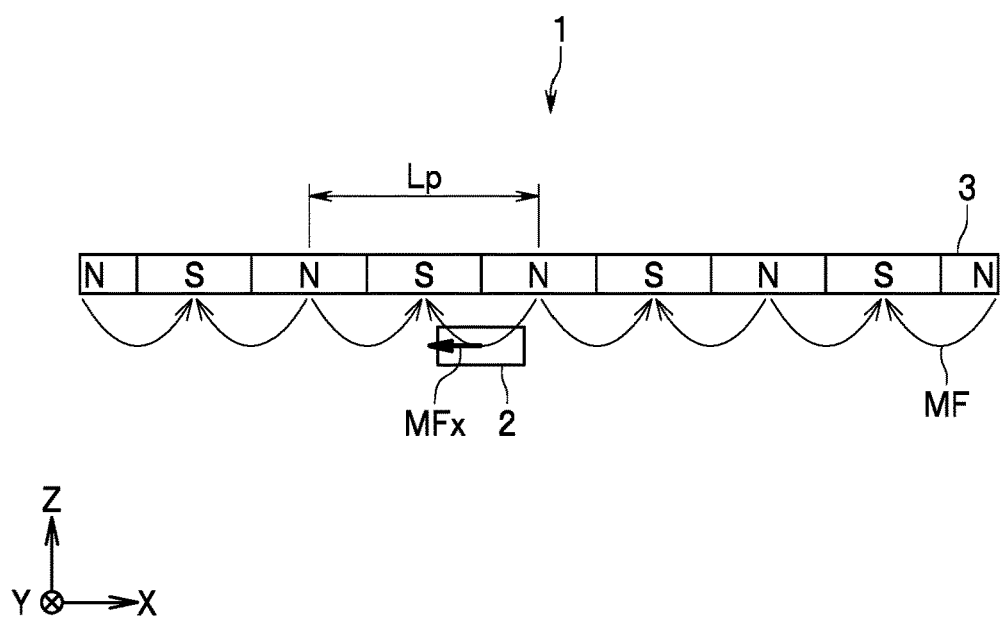
FIG. 2 is a front view showing the magnetic encoder according to the first example embodiment of the technology.

A schematic configuration of a magnetic encoder according to a first example embodiment of the technology will initially be described with reference to FIGS. 1 and 2. FIG. 1 is a perspective view showing a magnetic encoder 1. FIG. 2 is a front view showing the magnetic encoder 1. The magnetic encoder 1 according to the present example embodiment includes a magnetic sensor device 2 according to the present example embodiment and a magnetic field generator 3.

The magnetic field generator 3 generates a target magnetic field MF that is a magnetic field for position detection and a magnetic field for the magnetic sensor device 2 to detect (magnetic field to be detected). The target magnetic field MF includes a magnetic field component in a direction parallel to an imaginary straight line. The magnetic sensor device 2 and the magnetic field generator 3 are configured such that the strength of the magnetic field component in a reference position changes when at least one of the magnetic sensor device 2 and the magnetic field generator 3 operates. The reference position may be a position in which the magnetic sensor device 2 is located. The magnetic sensor device 2 detects the target magnetic field MF including the magnetic field component, and generates at least one detection signal corresponding to the strength of the magnetic field component.

Aspects of the operation of the magnetic sensor device 2 and the magnetic field generator 3 include a first aspect in which at least one of the magnetic sensor device 2 and the magnetic field generator 3 moves, and a second aspect in which at least one of the magnetic sensor device 2 and the magnetic field generator 3 rotates. In the first aspect, the position of the magnetic field generator 3 relative to the magnetic sensor device 2 changes, but, in the second aspect, the position of the magnetic field generator 3 relative to the magnetic sensor device 2 need not necessarily change.

The magnetic field generator 3 may be a magnetic scale including a plurality of pairs of N and S poles alternately arranged in a predetermined direction. The magnetic scale may be a magnetic medium, such as a magnetic tape, that is alternately magnetized to a plurality of pairs of N and S poles. The magnetic scale may be a plurality of magnets arranged in the foregoing predetermined direction. The predetermined direction may be a linear direction or a rotational direction. When the predetermined direction is the linear direction, the magnetic sensor device 2 or the magnetic field generator 3 may be movable within a predetermined range in the linear direction. When the predetermined direction is the rotational direction, the magnetic sensor device 2 or the magnetic field generator 3 may be rotatable within a predetermined range in the rotational direction.

In the present example embodiment, the magnetic field generator 3 is a linear scale magnetized to a plurality of pairs of N and S poles in a linear direction. The magnetic sensor device 2 or the magnetic field generator 3 is movable in the longitudinal direction of the magnetic field generator 3. As shown in FIG. 2, a distance between two N poles adjoining in the longitudinal direction of the magnetic field generator 3, in other words, a center-to-center distance between the two N poles adjoining via one S pole will be referred to as a magnetic pole pitch and denoted by a symbol Lp. The center-to-center distance between the two S poles adjoining via one N pole is equal to the magnetic pole pitch Lp.

Now, we define X, Y, and Z directions as shown in FIGS. 1 and 2. In the present example embodiment, a direction parallel to the longitudinal direction of the magnetic field generator 3 will be referred to as the X direction. Two mutually orthogonal directions perpendicular to the X direction are referred to as the Y and Z directions. In FIG. 2, the Y direction is shown as a direction from the near side to the far side of FIG. 2. The opposite directions to the X, Y, and Z directions will be referred to as −X, −Y, and −Z directions, respectively. The expression "viewed in the Z direction" means that a target is viewed from a position away from the target in the Z direction.

The magnetic sensor device 2 is located at a position away from the magnetic field generator 3 in the −Z direction. The magnetic sensor device 2 includes a magnetic sensor configured to be able to detect the strength of a magnetic field component MFx of the target magnetic field MF in a direction parallel to the X direction. Note that the magnetic sensor is shown in FIGS. 3, 5, 7, and 8 to be described below. For example, the strength of the magnetic field component MFx is expressed in positive values if the direction of the magnetic field component MFx is the X direction, and in negative values if the direction of the magnetic field component MFx is the −X direction. When the magnetic field generator 3 is fixed to a predetermined position, the strength of the magnetic field component MFx changes with the position in the direction parallel to the X direction. Hence, the strength of the magnetic field component MFx detected by the magnetic sensor device 2 changes periodically as the magnetic sensor device 2 or the magnetic field generator 3 moves in the direction parallel to the X direction. The direction parallel to the X direction corresponds to a "first direction" in the technology.

Figure 3:
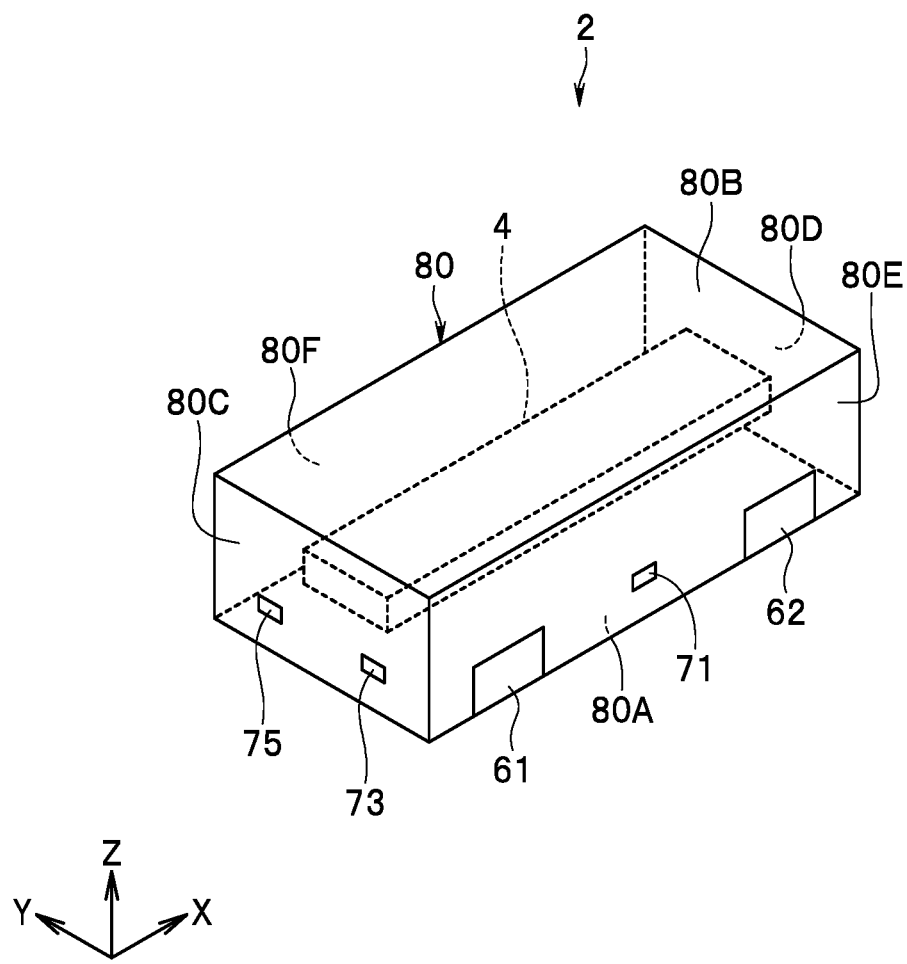
FIG. 3 is a perspective view showing a magnetic sensor device according to the first example embodiment of the technology.
Figure 4:
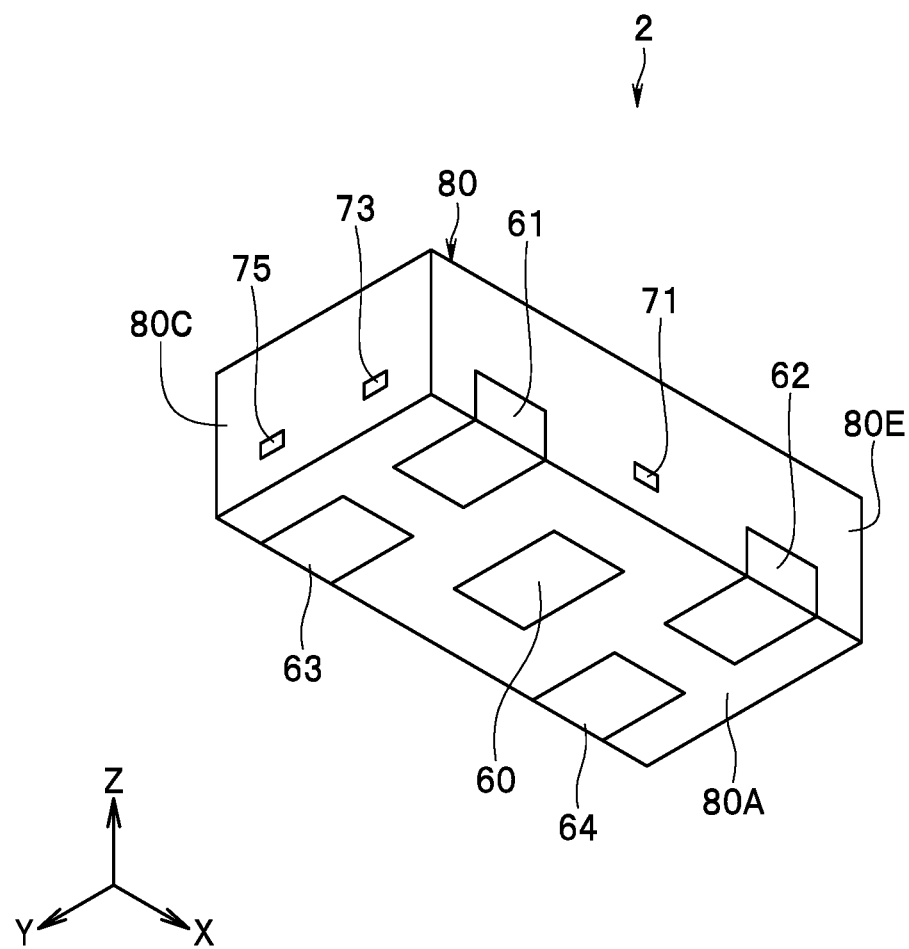
FIG. 4 is a perspective view showing the magnetic sensor device according to the first example embodiment of the technology.
Figure 5:
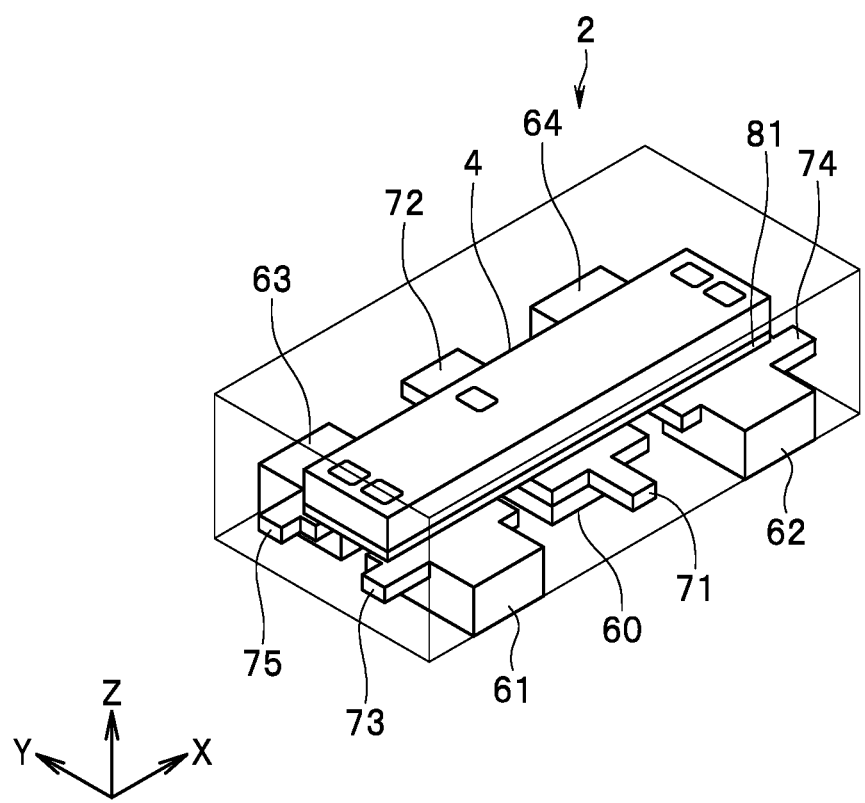
FIG. 5 is a perspective view showing the inside of the magnetic sensor device according to the first example embodiment of the technology.
Figure 6:
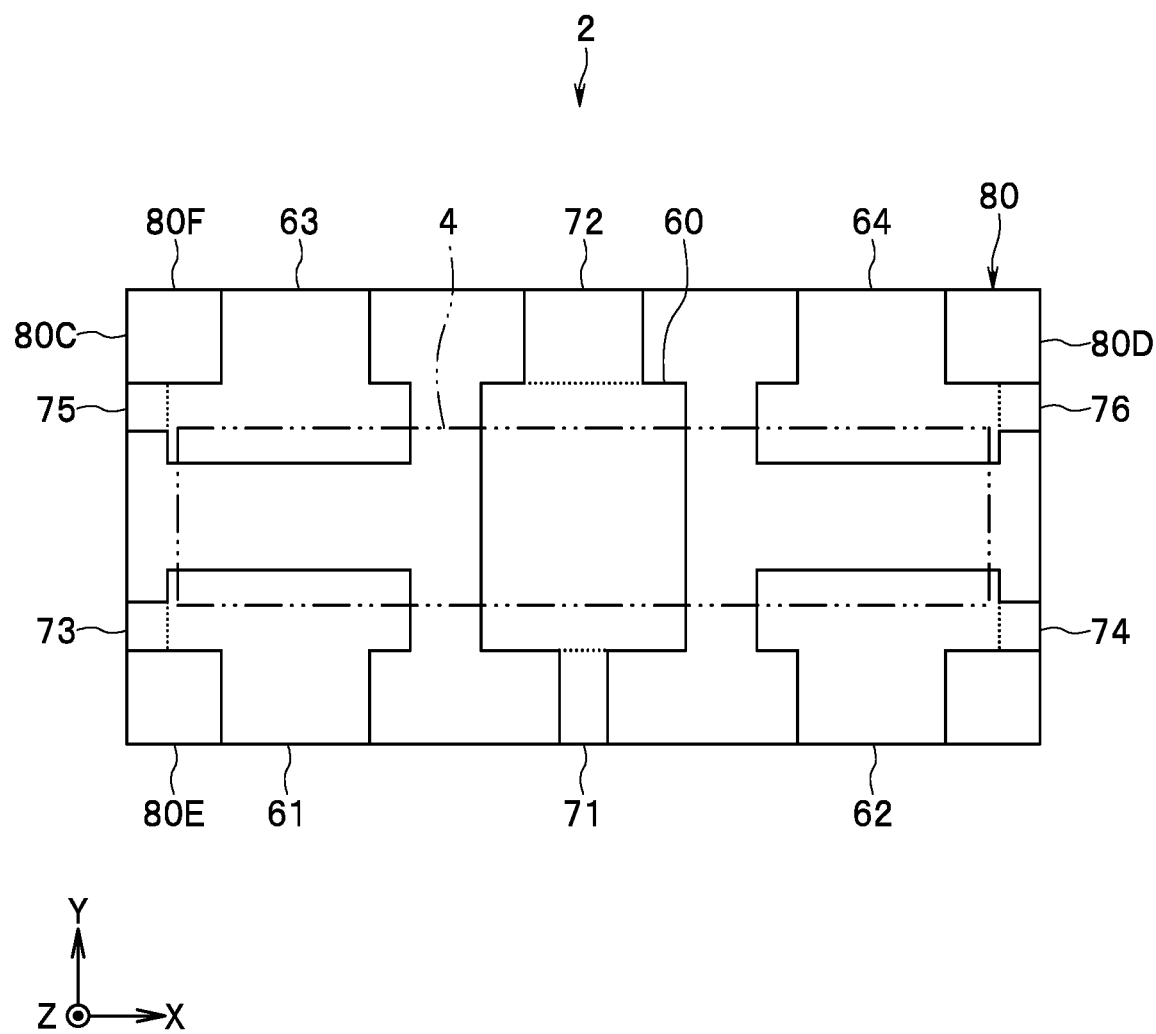
FIG. 6 is a plan view showing the inside of the magnetic sensor device according to the first example embodiment of the technology.

Next, the magnetic sensor device 2 will be described in detail with reference to FIGS. 3 to 6. FIGS. 3 and 4 are perspective views showing the magnetic sensor device 2. FIG. 5 is a perspective view showing the inside of the magnetic sensor device 2. FIG. 6 is a plan view showing the inside of the magnetic sensor device 2.

The magnetic sensor device 2 includes a magnetic sensor 4. The magnetic sensor 4 may be supported by a support. This support may be formed of a conductive material. In the present example embodiment, the magnetic sensor device 2 includes a die pad 60 as the support supporting the magnetic sensor 4.

The magnetic sensor device 2 further includes a plurality of leads. In the present example embodiment, the number of the plurality of leads is four. The four leads will be denoted by reference numerals 61, 62, 63, and 64 below. As will be described below, the magnetic sensor 4 includes a plurality of pads (electrodes). The plurality of pads are connected to leads 61 to 64 by a plurality of bonding wires.

The magnetic sensor 4 is joined to the die pad 60 by an adhesive agent 81, for example. The magnetic sensor 4 may be further joined to the leads 61 to 64 by the adhesive agent 81.

The magnetic sensor device 2 further includes a sealing resin that seals the magnetic sensor 4. The sealing resin constitutes large part of a package body (simply referred to as a body below) 80 of the magnetic sensor device 2.

In particular, in the present example embodiment, the body 80 has a substantially rectangular parallelepiped shape. The body 80 has a bottom surface 80A, a top surface and four side surfaces 80C to 80F, which constitute the peripheral portion of the body 80. The bottom surface 80A and the top surface 80B face opposite to each other. The side surfaces 80C and 80D also face opposite to each other, and the side surfaces 80E and 80F also face opposite to each other. The side surfaces 80C to 80F are perpendicular to the bottom surface 80A and the top surface 80B. FIG. 3 shows the magnetic sensor device 2 viewed from the top surface 80B side. FIG. 4 shows the magnetic sensor device 2 viewed from the bottom surface 80A side.

As shown in FIGS. 3 and 4, the bottom surface 80A is located at a −Z-direction end of the body 80. The top surface 80B is located at a Z-direction end of the body 80. The side surface 80C is located at a −X-direction end of the body 80. The side surface 80D is located at an X-direction end of the body 80. The side surface 80E is located at a −Y-direction end of the body 80. The side surface 80F is located at a Y-direction end of the body 80.

The leads 61 and 62 are arranged at and near a ridge line between the bottom surface 80A and the side surface 80E. The leads 61 and 62 are arranged in this order in the X direction. The leads 63 and 64 are arranged at and near a ridge line between the bottom surface 80A and the side surface 80F. The leads 63 and 64 are arranged in this order in the X direction.

Each of the die pad 60 and the leads 61 and 64 has an exposed surface not covered by the sealing resin. The exposed surface of each of the die pad 60 and the leads 61 and 64 may be covered by a not-shown plating layer.

The magnetic sensor device 2 further includes sub-leads 71 and 72 connected to the die pad 60. In FIG. 6, each of a border between the die pad 60 and the sub-lead 71 and a border between the die pad 60 and the sub-lead 72 is shown by a dotted line. The sub-lead 71 is exposed at the side surface 80E. The sub-lead 72 is exposed at the side surface 80F. The dimension of the sub-lead 72 in the direction parallel to the X direction is larger than the dimension of the sub-lead 71 in the direction parallel to the X direction. The magnetic sensor device 2 further includes sub-leads 73, 74, 75, and 76 connected to the leads 61, 62, 63, and 64, respectively. In FIG. 6, a border between one lead and one sub-lead is shown by a dotted line. The sub-leads 73 and 75 are exposed at the side surface 80C. The sub-leads 74 and 76 are exposed at the side surface 80D.

The magnetic sensor device 2 is mounted on a mount in a posture that the bottom surface 80A of the body 80 faces the mount. The mount may be a substrate including a circuit, for example. The die pad 60 need not necessarily be connected to an external circuit, such as the circuit of the substrate, in a state where the magnetic sensor device 2 is mounted on the mount. Alternatively, the die pad 60 may be connected to an external circuit having no effect on operation of the magnetic sensor 4.

The magnetic sensor device 2 shown in FIGS. 3 to 6 may be a dual flatpack no-leaded (DFN) package provided with no lead terminal extending outside from the body 80.

Figure 7:
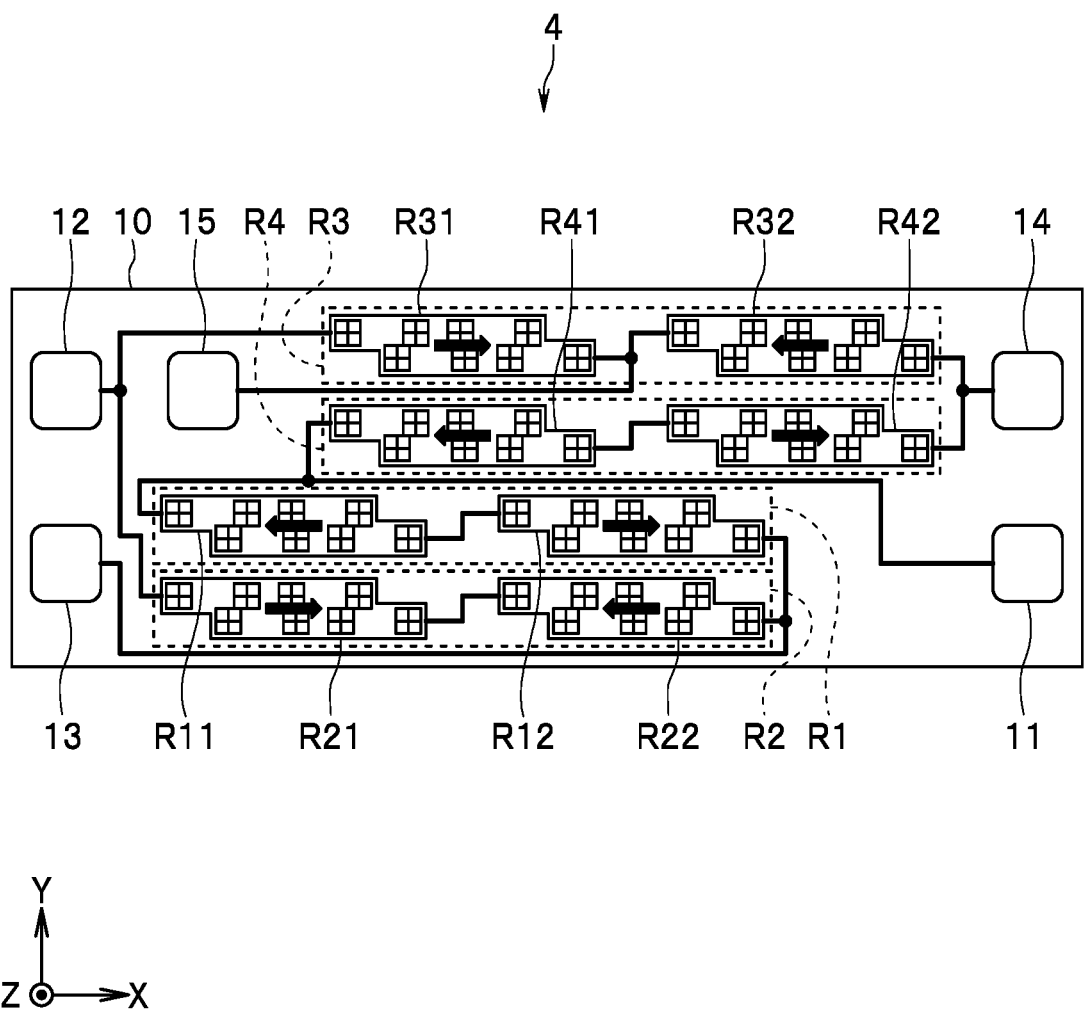
FIG. 7 is a plan view showing a magnetic sensor of the first example embodiment of the technology.
Figure 8:
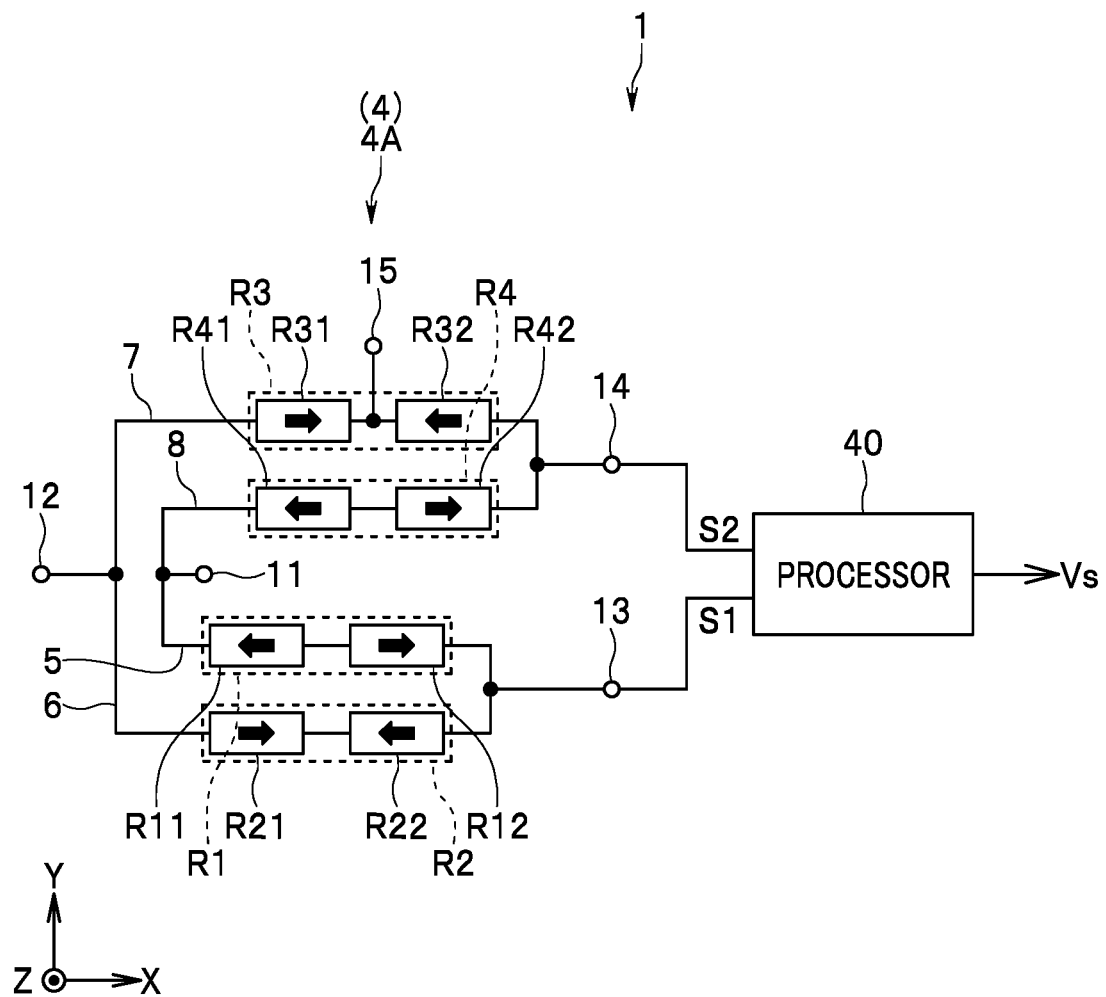
FIG. 8 is a circuit diagram showing a configuration of the magnetic sensor of the first example embodiment of the technology.

Next, the magnetic sensor 4 will be described in detail with reference to FIGS. 7 and 8. FIG. 7 is a plan view showing the magnetic sensor 4. FIG. 8 is a circuit diagram showing a configuration of the magnetic sensor 4. As shown in FIG. 8, the magnetic encoder 1 further includes a processor 40. The processor 40 generates a detection value Vs having a correspondence with the position of the magnetic sensor device 2 or the magnetic field generator 3 on the basis of an at least one detection signal generated by the magnetic sensor 4 and corresponding to the strength of the magnetic field component MFx. The processor 40 can be implemented by an application specific integrated circuit (ASIC) or a microcomputer, for example.

The magnetic sensor 4 includes a bridge circuit 4A and a plurality of pads (electrodes) electrically connected to the bridge circuit 4A. The bridge circuit 4A includes a plurality of arms. Each of the plurality of arms is constituted of a plurality of magnetic detection elements (referred to as MR elements below) and also configured such that the resistances change according to change of the strength of the magnetic field component MFx. Each of the plurality of arms is configured to have sensitivity to the magnetic field component MFx while not having sensitivity to an external magnetic field with strength and a direction being the same irrespective of the position in the direction parallel to the X direction. The external magnetic field as described above will be referred to as a uniform external magnetic field below.

Each of the plurality of pads is electrically connected to a corresponding one of the leads 61 to 64 shown in FIGS. 3 and 4.

In the present example embodiment, the magnetic sensor 4 includes four pads 11, 12, 13, and 14 as the plurality of pads. The bridge circuit 4A includes four arms R1, R2, R3, and R4 as the plurality of arms. The arm R1 is provided between the pad 11 and the pad 13 in circuit configuration. The arm R2 is provided between the pad 12 and the pad 13 in circuit configuration. The arm R3 is provided between the pad 12 and the pad 14 in circuit configuration. The arm R4 is provided between the pad 11 and the pad 14 in circuit configuration. Note that, in this application, the expression "in circuit configuration" is used to indicate a layout in a circuit diagram and not a layout in a physical configuration.

The pad 11 is used as a power supply port of the magnetic sensor 4 and is connected to a power supply. The pad 12 is used as a ground port of the magnetic sensor 4 and is connected to the ground. The pads 13 and 14 are used as signal ports of the magnetic sensor 4 and are connected to the processor 40.

The magnetic sensor 4 may be driven by a constant voltage or driven by a constant current. In the case where the magnetic sensor 4 is driven by a constant voltage, a voltage of predetermined magnitude is applied to the pad 11. In the case where the magnetic sensor 4 is driven by a constant current, a current of predetermined magnitude is supplied to the pad 11.

The magnetic sensor 4 generates a signal having a correspondence with the potential at the pad 13 as a first detection signal S1, and generates a signal having a correspondence with the potential at the pad 14 as a second detection signal S2. The processor 40 generates the detection value Vs on the basis of the first and second detection signals S1 and S2. At least one of the magnetic sensor 4 and the processor 40 may be configured to be able to correct the amplitude, phase, and offset of each of the first and second detection signals S1 and S2.

Each of the arms R1 to R4 includes two resistors connected in series. Each of the two resistors is constituted of a plurality of MR elements and also configured such that the resistance changes with the strength of the magnetic field component MFx. In each of the arms R1 to R4, the two resistors are configured such that the resistances of the two respective resistors change in the same phase according to periodic change of the strength of the magnetic field component MFx and configured such that the resistances of the two respective resistors change in opposite phases according to periodic change of the strength or the direction of the uniform external magnetic field.

In the following, the two resistors of the arm R1 are denoted by reference numerals R11 and R12, the two resistors of the arm R2 are denoted by reference numerals R21 and R22, the two resistors of the arm R3 are denoted by reference numerals R31 and R32, and the two resistors of the arm R4 are denoted by reference numerals R41 and R42.

The resistors R11, R12, R21, R22, R31, R32, R41, and R42 satisfy the following requirements about the layout in circuit configuration. The resistors R11 and R12 are provided in this order from the pad 11 side in a first path 5 that connects the pad 11 and the pad 13. The resistors R21 and R22 are provided in this order from the pad 12 side in a second path 6 that connects the pad 12 and the pad 13. The resistors R31 and R32 are provided in this order from the pad 12 side in a third path 7 that connects the pad 12 and the pad 14. The resistors R41 and R42 are provided in this order from the pad 11 side in a fourth path 8 that connects the pad 11 and the pad 14.

The magnetic sensor 4 further includes a sub-pad 15. The sub-pad 15 is electrically connected between one end and another end of the arm R3. In particular, in the present example embodiment, the sub-pad 15 is electrically connected to a connection point of the resistors R31 and R32.

As shown in FIG. 7, the magnetic sensor 4 further includes a substrate 10. The pads 11 to 14, the sub-pad 15, and the resistors R11, R12, R21, R22, R31, R32, R41, and R42 are provided on the substrate 10.

Figure 9:
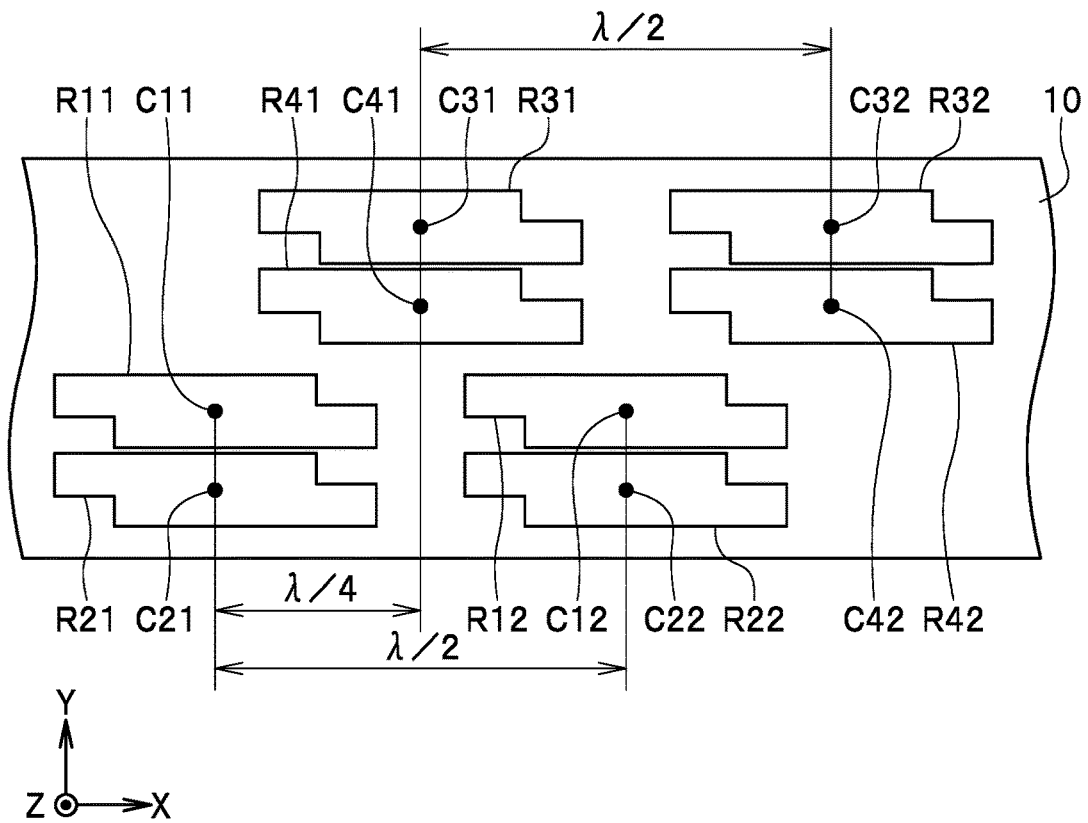
FIG. 9 is an explanatory diagram for describing a layout of a plurality of resistors of the first example embodiment of the technology.

Next, the layout of the resistors R11, R12, R21, R22, R31, R32, R41, and R42 will be described with reference to FIG. 9. FIG. 9 is an explanatory diagram for describing the layout of the resistors R11, R12, R21, R22, R31, R32, R41, and R42. A resistance of each of the resistors R11, R12, R21, and R22 has a correspondence with the first detection signal S1. A resistance of each of the resistors R31, R32, R41, and R42 has a correspondence with the second detection signal S2. A group of the resistors R11, R12, R21, and R22 and a group of the resistors R31, R32, R41, and R42 are arranged in positions different from each other in the direction parallel to the X direction such that a phase of the first detection signal S1 and a phase of the second detection signal S2 are different from each other.

In FIG. 9, a reference numeral C11 denotes a first position inside the resistor R11, a reference numeral C12 denotes a second position inside the resistor R12, a reference numeral C21 denotes a third position inside the resistor R21, and a reference numeral C22 denotes a fourth position inside the resistor R22. The first to fourth positions C11, C12, C21, and C22 are positions for determining physical positions of the resistors R11, R12, R21, and R22, respectively. In particular, in the present example embodiment, the first position C11 is the center of gravity of the resistor R11 when viewed in the Z direction, the second position C12 is the center of gravity of the resistor R12 when viewed in the Z direction, the third position C21 is the center of gravity of the resistor R21 when viewed in the Z direction, and the fourth position C22 is the center of gravity of the resistor R22 when viewed in the Z direction.

In FIG. 9, a reference numeral C31 denotes a fifth position inside the resistor R31, a reference numeral C32 denotes a sixth position inside the resistor R32, a reference numeral C41 denotes a seventh position inside the resistor R41, and a reference numeral C42 denotes an eighth position inside the resistor R42. The fifth to eighth positions C31, C32, C41, and C42 are positions for determining physical positions of the resistors R31, R32, R41, and R42, respectively. In particular, in the present example embodiment, the fifth position C31 is the center of gravity of the resistor R31 when viewed in the Z direction, the sixth position C32 is the center of gravity of the resistor R32 when viewed in the Z direction, the seventh position C41 is the center of gravity of the resistor R41 when viewed in the Z direction, and the eighth position C42 is the center of gravity of the resistor R42 when viewed in the Z direction.

Now, a design pitch $\lambda$ is defined as described below. The design pitch $\lambda$ is four times a distance between a predetermined position in the resistor R11 and a predetermined position in the resistor R31 in the direction parallel to the X direction. In particular, in the present example embodiment, the predetermined position in the resistor R11 is the first position C11, and the predetermined position in the resistor R31 is the fifth position C31.

In particular, in the present example embodiment, a distance between the first position C11 and the fifth position C31 in the direction parallel to the X direction, a distance between the second position C12 and the sixth position C32 in the direction parallel to the X direction, a distance between the third position C21 and the seventh position C41 in the direction parallel to the X direction, and a distance between the fourth position C22 and the eighth position C42 in the direction parallel to the X direction are equal to one another. Therefore, the design pitch $\lambda$ can also be defined by using a pair of the resistors R12 and R32, a pair of the resistors R21 and R41, or a pair of the resistors R22 and R42 instead of a pair of the resistors R11 and R31.

Here, assume a specific magnetic field generator including a plurality of pairs of an N pole and an S pole and having a phase difference of 90° between the first detection signal S1 and the second detection signal S2. The design pitch $\lambda$ is substantially equal to the distance between two N poles adjoining via one S pole. The specific magnetic field generator may be the magnetic field generator 3 shown in FIG. 2. In this case, the design pitch $\lambda$ is equal to the magnetic pole pitch Lp shown in FIG. 2. Alternatively, the specific magnetic field generator may be a magnetic field generator having a magnetic pole pitch different from the magnetic pole pitch Lp of the magnetic field generator 3. In this case, the design pitch $\lambda$ has a size different from the magnetic pole pitch Lp. A case where the specific magnetic field generator is the magnetic field generator 3, in other words, a case where the design pitch $\lambda$ is equal to the magnetic pole pitch Lp will be described as an example below.

The resistors R11, R12, R21, R22, R31, R32, R41, and R42 satisfy the following requirements about the physical layout. A distance between the first position C11 and the second position C12 in the direction parallel to the X direction is equal to an odd number of times ½ of the design pitch $\lambda$. A distance between the third position C21 and the fourth position C22 in the direction parallel to the X direction is equal to an odd number of times ½ of the design pitch $\lambda$. A distance between the first position C11 and the third position C21 in the direction parallel to the X direction is equal to zero or an integral number of times of the design pitch $\lambda$.

A distance between the fifth position C31 and the sixth position C32 in the direction parallel to the X direction is equal to an odd number of times ½ of the design pitch $\lambda$. A distance between the seventh position C41 and the eighth position C42 in the direction parallel to the X direction is equal to an odd number of times ½ of the design pitch $\lambda$. A distance between the fifth position C31 and the seventh position C41 in the direction parallel to the X direction is equal to zero or an integral number of times of the design pitch $\lambda$. A distance between the first position C11 and the fifth position C31 in the direction parallel to the X direction is equal to (4n-3)/4 of the design pitch $\lambda$. Note that n is an integer of one or more.

In the present example embodiment, the second position C12 is a position $\lambda/2$ away from the first position C11 in the X direction, and the fourth position C22 is a position $\lambda/2$ away from the third position C21 in the X direction. The distance between the first position C11 and the third position C21 in the direction parallel to the X direction is zero. In other words, the third position C21 in the direction parallel to the X direction is the same as the first position C11 in the same direction. The third position C21 is located in front of the first position C11 in the −Y direction. The fourth position C22 in the direction parallel to the X direction is the same as the second position C12 in the same direction. The fourth position C22 is located in front of the second position C12 in the −Y direction.

The resistors R31, R32, R41, and R42 are located in front of the resistors R11, R12, R21, and R22 in the Y direction. The rule of the physical layout of the resistors R31, R32, R41, and R42 is similar to the rule of the physical layout of the resistors R11, R12, R21, and R22. When the resistors R11, R12, R21, and R22 and the first to fourth positions C11, C12, C21, and C22 in the description of the physical layout of the resistors R11, R12, R21, and R22 are replaced by the resistors R31, R32, R41, and R42 and the fifth to eighth positions C31, C32, C41, and C42, respectively, this corresponds to the description of the physical layout of the resistors R31, R32, R41, and R42.

In the present example embodiment, the fifth position C31 (seventh position C41) is located $\lambda/4$ in front of the first position C11 (third position C21) in the X direction. The sixth position C32 (eighth position C42) is located $\lambda/4$ in front of the second position C12 (fourth position C22) in the X direction.

Next, a configuration of the resistors R11, R12, R21, R22, R31, R32, R41, and R42 will be described. Each of the first and second detection signals S1 and S2 contains an ideal component which varies periodically with a predetermined signal period in such a manner as to trace an ideal sinusoidal curve (including sine and cosine waveforms). In the present example embodiment, the resistors R11, R12, R21, R22, R31, R32, R41, and R42 are configured such that the ideal component of the first detection signal S1 and the ideal component of the second detection signal S2 have respective different phases. The magnetic pole pitch Lp shown in FIG. 2 and the design pitch $\lambda$, shown in FIG. 9 correspond to one period of the ideal component, in other words, an electrical angle of 360°.

Each of the first and second detection signals S1 and S2 contains a plurality of harmonic components corresponding to higher-order harmonics of the ideal component aside from the ideal component. In the present example embodiment, the resistors R11, R12, R21, R22, R31, R32, R41, and R42 are configured to reduce the plurality of harmonic components.

In the following, the configuration of the resistors R11, R12, R21, R22, R31, R32, R41, and R42 will be described concretely. Initially, the configuration of the MR elements 50 will be described. In the present example embodiment, the MR elements 50 are each a spin-valve MR element. The spin-valve MR element includes a magnetization pinned layer, a free layer, and a gap layer located between the magnetization pinned layer and the free layer. The magnetization pinned layer has a first magnetization whose direction is fixed. The free layer has a second magnetization whose direction is variable within a plane (within an XY plane) parallel to both of the direction parallel to the X direction and a direction parallel to the Y direction. The magnetization pinned layer, the free layer, and the gap layer are stacked in a direction parallel to the Z direction.

The spin-valve MR element may be a tunneling magnetoresistive (TMR) element or a giant magnetoresistive (GMR) element. In particular, in the present example embodiment, the MR element 50 is desirably a TMR element to reduce the dimensions of the magnetic sensor 4. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°.

In FIGS. 7 and 8, arrows shown inside the resistors R11, R12, R21, R22, R31, R32, R41, and R42 indicate first magnetization directions of the magnetization pinned layers in the plurality of respective MR elements 50 included in the resistors.

The resistors R11, R12, R21, R22, R31, R32, R41, and R42 satisfy the following requirement about magnetization of the magnetization pinned layers. The first magnetization of the magnetization pinned layers in the resistors R11 and R22 contains a component in a first magnetization direction being one direction parallel to the above-described first direction (the direction parallel to the X direction). The first magnetization of the magnetization pinned layers in the resistors R12 and R21 contains a component in a second magnetization direction opposite to the first magnetization direction. The first magnetization of the magnetization pinned layers in the resistors R31 and R42 contains the component in the second magnetization direction. The first magnetization of the magnetization pinned layers in the resistors R32 and R41 contains the component in the first magnetization direction. In particular, in the present example embodiment, the first magnetization direction is the −X direction, and the second magnetization direction is the X direction.

Note that, when the first magnetization contains a component in a specific magnetization direction, the component in the specific magnetization direction may be a main component of the first magnetization. Alternatively, the first magnetization may not contain a component in a direction orthogonal to the specific magnetization direction. In the present example embodiment, when the first magnetization contains the component in the specific magnetization direction, the first magnetization direction is the specific magnetization direction or substantially the specific magnetization direction.

The second magnetization directions of the free layers in the respective plurality of MR elements 50 change within the XY plane with the strength of the magnetic field component MFx. Consequently, the potential at each of the pads 13 and 14 (signal ports) changes with the strength of the magnetic field component MFx.

Next, the layout of the plurality of MR elements 50 in each of the resistors R11, R12, R21, R22, R31, R32, R41, and R42 will be described. As employed herein, a set of one or more MR elements 50 will be referred to as an element group. Each of the resistors R11, R12, R21, R22, R31, R32, R41, and R42 includes a plurality of element groups. To reduce an error component, the plurality of element groups are located at predetermined distances from each other on the basis of the design pitch λ. In the following description, the layout of the plurality of element groups will be described with reference to predetermined positions of the element groups. An example of the predetermined position of an element group is the center of gravity of the element group when viewed in the Z direction.

Figure 10:
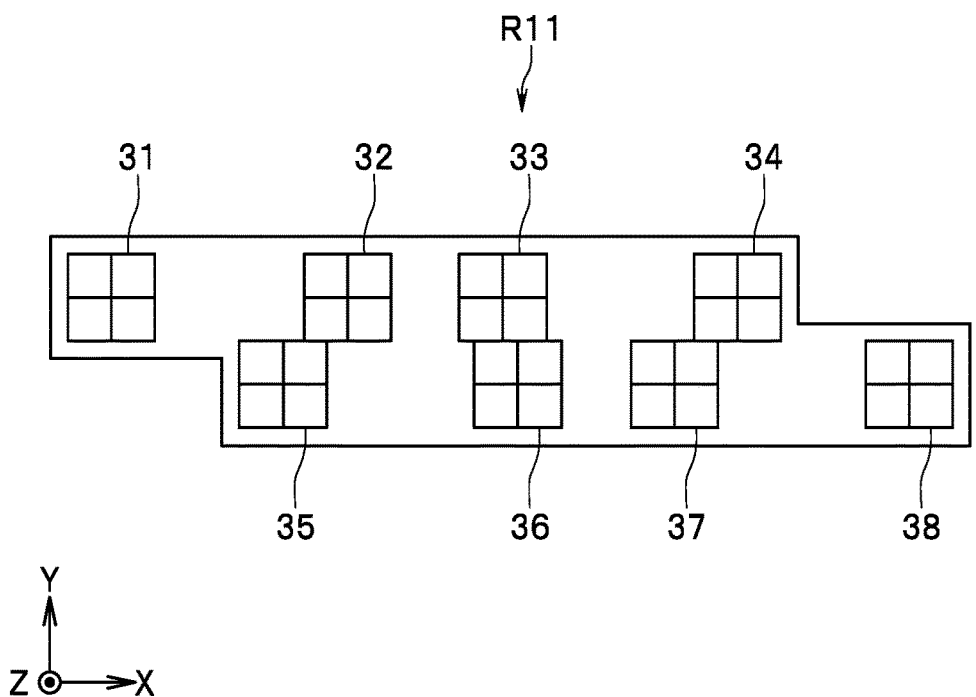
FIG. 10 is a plan view showing one resistor of the first example embodiment of the technology.

FIG. 10 is a plan view showing the resistor R11. As shown in FIG. 10, the resistor R11 includes eight element groups 31, 32, 33, 34, 35, 36, 37, and 38. Each of the element groups 31 to 38 is divided into four sections. Each section includes one or more MR elements 50. In other words, each element group includes four or more MR elements 50. The plurality of MR elements 50 may be connected in series within the element group. In such a case, the plurality of element groups may be connected in series. Alternatively, the plurality of MR elements 50 may be connected in series regardless of the element groups.

In FIG. 10, the element groups 31 to 38 are located to reduce a harmonic component corresponding to a third harmonic (third-order harmonic) of the ideal component, a harmonic component corresponding to a fifth harmonic (fifth-order harmonic) of the ideal component, and a harmonic component corresponding to a seventh harmonic (seventh-order harmonic) of the ideal component. As shown in FIG. 10, the element groups 31 to 34 are arranged in the X direction. The element group 32 is located at a position λ/10 away from the element group 31 in the X direction. The element group 33 is located at a position λ/6 away from the element group 31 in the X direction. The element group 34 is located at a position λ/10+λ/6 away from the element group 31 in the X direction (at a position λ/6 away from the element group 32 in the X direction).

As shown in FIG. 10, the element groups 35 to 38 are arranged in the X direction in front of the element groups 31 to 34 in the −Y direction. The element group 35 is located at a position λ/14 away from the element group 31 in the X direction. The element group 36 is located at a position λ/14+λ/10 away from the element group 31 in the X direction (at a position λ/14 away from the element group 32 in the X direction). The element group 37 is located at a position λ/14+λ/6 away from the element group 31 in the X direction (at a position λ/14 away from the element group 33 in the X direction). The element group 38 is located at a position λ/14+λ/10+λ/6 away from the element group 31 in the X direction (at a position λ/14 away from the element group 34 in the X direction).

The layout of the plurality of element groups for reducing the plurality of harmonic components is not limited to the example shown in FIG. 10. Suppose now that k and m are integers that are greater than or equal to 1 and different from each other. For example, to reduce a harmonic component corresponding to a (2k+1)th-order harmonic, a first element group is located at a position λ/(4k+2) away from a second element group in the X direction. Further, to reduce an error component corresponding to a (2m+1)th-order harmonic, a third element group is located at a position $\lambda/(4m+2)$ away from the first element group in the X direction, and a fourth element group is located at a position $\lambda/(4m+2)$ away from the second element group in the X direction. In such a manner, to reduce harmonic components corresponding to a plurality of harmonics, each of a plurality of element groups for reducing an error component corresponding to one harmonic is located at a position a predetermined distance based on the design pitch $\lambda$ away from each of a plurality of element groups for reducing an error component corresponding to another harmonic in the X direction.

In the present example embodiment, the configuration and layout of the plurality of element groups in each of the resistors R12, R21, R22, R31, R32, R41, and R42 are the same as those of the plurality of element groups in the resistor R11. Specifically, each of the resistors R12, R21, R22, R31, R32, R41, and R42 also includes the eight element groups 31 to 38 having the configuration and positional relationship shown in FIG. 10. Note that the element group 31 of the resistor R21 is located at the same position as the element group 31 of the resistor R11 is in the X direction. The element group 31 of the resistor R22 is located at the same position as the element group 31 of the resistor R12 is in the X direction. The element group 31 of the resistor R12 is located at a position $\lambda/2$ away from the element group 31 of the resistor R11 in the X direction. The element group 31 of the resistor R22 is located at a position $\lambda/2$ away from the element group 31 of the resistor R21 in the X direction.

The element group 31 of the resistor R41 is located at the same position as the element group 31 of the resistor R31 is in the X direction. The element group 31 of the resistor R42 is located at the same position as the element group 31 of the resistor R32 is in the X direction. The element group 31 of the resistor R31 is located at a position $\lambda/4$ away from the element group 31 of the resistor R11 in the X direction. The element group 31 of the resistor R32 is located at a position $\lambda/2$ away from the element group 31 of the resistor R31 in the X direction. The element group 31 of the resistor R42 is located at a position $\lambda/2$ away from the element group 31 of the resistor R41 in the X direction.

The configuration of the resistors R11, R12, R21, R22, R31, R32, R41, and R42 described above makes a phase difference of the ideal component of the second detection signal S2 from the ideal component of the first detection signal S1 an odd number of times ¼ of a predetermined signal period (the signal period of the ideal component), and reduces the plurality of harmonic components of the respective first and second detection signals S1 and S2.

Note that, in the light of the production accuracy of the MR elements 50 and other factors, the positions of the resistors R11, R12, R21, R22, R31, R32, R41, and R42 and the positions of the element groups 31 to 38 may be slightly different from the above-described positions.

Figure 11:
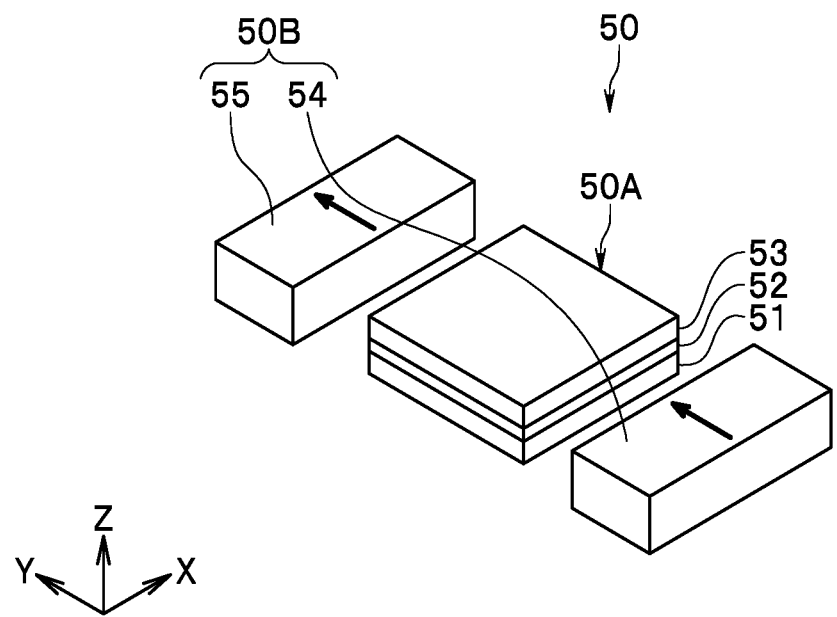
FIG. 11 is a perspective view showing a first example of a magnetoresistive element of the first example embodiment of the technology.

Next, first and second examples of the MR element 50 will be described with reference to FIGS. 11 and 12. FIG. 11 is a perspective view showing the first example of the MR element 50. In the first example, the MR element 50 includes a layered film 50A including a magnetization pinned layer 51, a gap layer 52, and a free layer 53 stacked in this order in the Z direction. The layered film 50A may have a circular planar shape, or a square or substantially square planar shape as shown in FIG. 11 when viewed in the Z direction.

The bottom surface of the layered film 50A of the MR element 50 is electrically connected to the bottom surface of the layered film 50A of another MR element 50 by a not-shown lower electrode. The top surface of the layered film 50A of the MR element 50 is electrically connected to the top surface of the layered film 50A of yet another MR element 50 by a not-shown upper electrode. In such a manner, the plurality of MR elements 50 are connected in series. It should be appreciated that the layers 51 to 53 of the layered film 50A may be stacked in the reverse order to that shown in FIG. 11.

The MR element 50 further includes a bias magnetic field generator 50B that generates a bias magnetic field to be applied to the free layer 53. The direction of the bias magnetic field intersects the direction parallel to the X direction. In the first example, the bias magnetic field generator 50B includes two magnets 54 and 55. The magnet 54 is located in front of the layered film 50A in the −Y direction. The magnet 55 is located in front of the layered film 50A in the Y direction. In particular, in the first example, the layered film 50A and the magnets 54 and 55 are located at positions to intersect an imaginary plane parallel to the XY plane. In FIG. 11, the arrows in the magnets 54 and 55 indicate the magnetization directions of the magnets 54 and 55. In the first example, the direction of the bias magnetic field is the Y direction.

Figure 12:
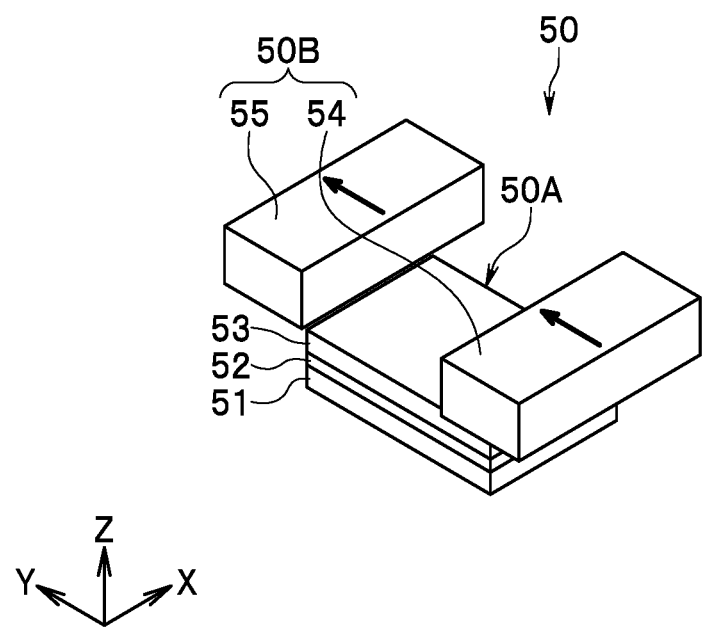
FIG. 12 is a perspective view showing a second example of the magnetoresistive element of the first example embodiment of the technology.

FIG. 12 is a perspective view showing the second example of the MR element 50. The second example of the MR element 50 has the same configuration as that of the first example of the MR element 50 except the planar shape of the layered film 50A and the positions of the magnets 54 and 55. In the second example, the magnets 54 and 55 are located at positions different from that of the layered film 50A in the Z direction. In particular, in the example shown in FIG. 12, the magnets 54 and 55 are located in front of the layered film 50A in the Z direction. When viewed in the Z direction, the layered film 50A has a rectangular planar shape long in the Y direction. When viewed in the Z direction, the magnets 54 and 55 are located to overlap the layered film 50A.

The direction of the bias magnetic field and the layout of the magnets 54 and 55 are not limited to the examples shown in FIGS. 11 and 12. For example, the direction of the bias magnetic field may be a direction intersecting the direction parallel to the X direction and the direction parallel to the Z direction, and may be a direction oblique to the Y direction. The magnets 54 and 55 may be located at respective different positions in the direction parallel to the X direction.

The bias magnetic field may be applied to the free layer 53 by uniaxial magnetic anisotropy such as magnetic shape anisotropy or magnetocrystalline anisotropy instead of the bias magnetic field generator 50B.

Figure 13:
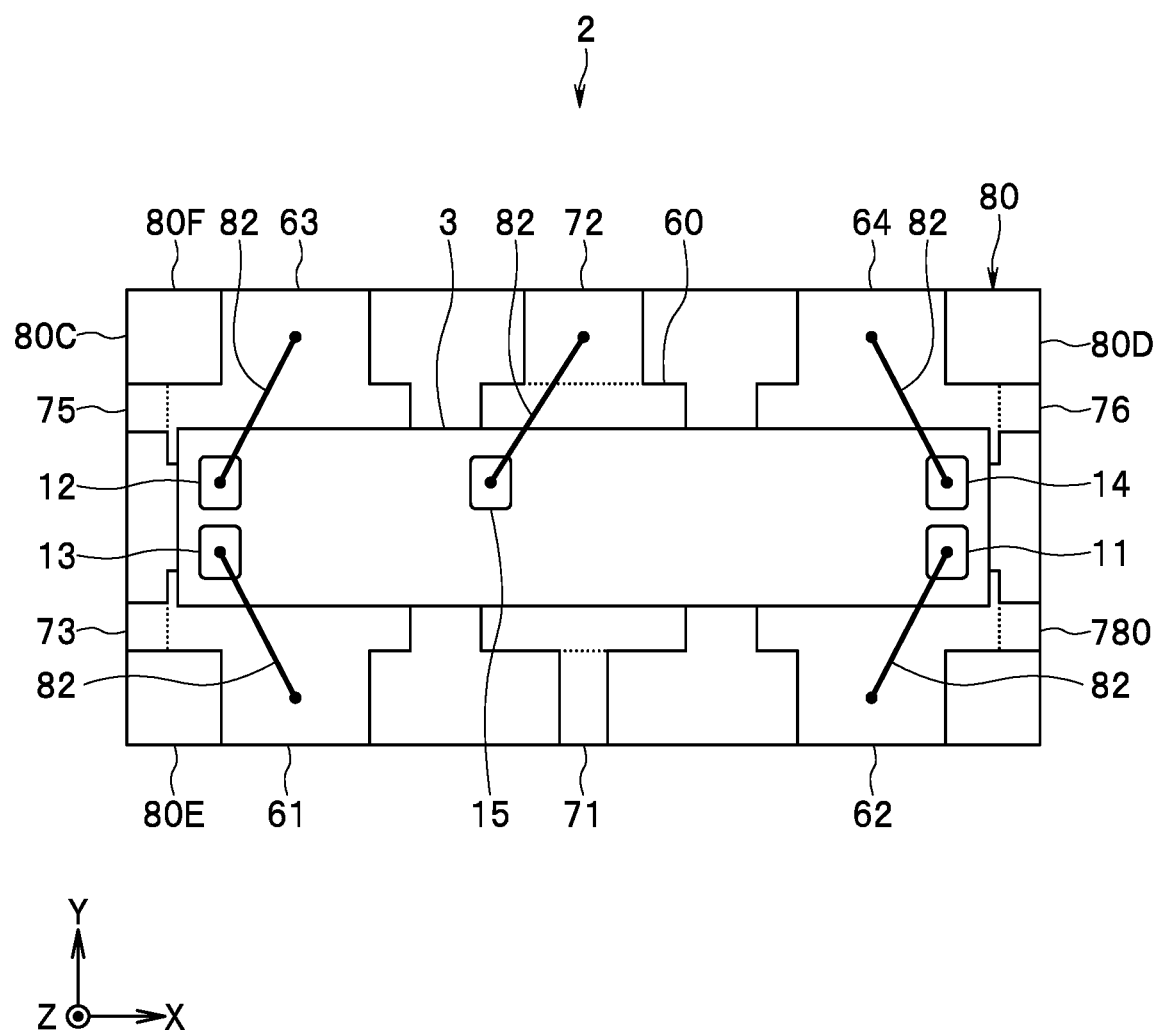
FIG. 13 is an explanatory diagram for describing a connection relationship between the magnetic sensor and a die pad and a plurality of leads of the first example embodiment of the technology.

Next, a connection relationship between the magnetic sensor 4 and the leads 61 to 64 and the die pad 60 of the magnetic sensor device 2 will be described with reference to FIG. 13. FIG. 13 is an explanatory diagram for describing the connection relationship. In FIG. 13, each reference numeral 82 denotes a bonding wire.

The pad 11 (power supply port) of the magnetic sensor 4 is electrically connected to the lead 62 by the bonding wire 82. The pad 12 (ground port) of the magnetic sensor 4 is electrically connected to the lead 63 by the bonding wire 82. The pad 13 (signal port) of the magnetic sensor 4 is electrically connected to the lead 61 by the bonding wire 82. The pad 14 (signal port) of the magnetic sensor 4 is electrically connected to the lead 64 by the bonding wire 82.

The sub-pad 15 is electrically connected to the die pad 60. In particular, in the present example embodiment, the sub-pad 15 is electrically connected to the die pad 60 by the bonding wire 82 and the sub-lead 72.

Next, a method for generating the detection value Vs of the present example embodiment will be described. For example, the processor 40 generates the detection value Vs in the following manner. The processor 40 determines an initial detection value in the range of 0° or more and less than 360° by calculating the arctangent of the ratio of the second detection signal S2 to the first detection signal S1, i.e., atan(S2/S1). The initial detection value may be the value of the arctangent itself. The initial detection value may be a value obtained by adding a predetermined angle to the value of the arctangent.

If the foregoing value of the arctangent is 0°, the position of an S pole of the magnetic field generator 3 and the position of the element group 31 in each of the resistors R11 and R21 coincide in the X direction. If the foregoing value of the arctangent is 180°, the position of an N pole of the magnetic field generator 3 and the position of the element group 31 in each of the resistors R11 and R21 coincide in the X direction. The initial detection value thus has a correspondence with the position of the magnetic field generator 3 relative to the magnetic sensor device 2 (hereinafter, also referred to as a relative position) within the magnetic pole pitch Lp.

The processor 40 also counts the number of rotations of the electrical angle from a reference position, with one period of the initial detection value as an electrical angle of 360°. One rotation of the electrical angle corresponds to the amount of movement of the relative position as much as the magnetic pole pitch Lp. The processor 40 generates the detection value Vs having a correspondence with the relative position on the basis of the initial detection value and the number of rotations of the electrical angle.

Next, a manufacturing method for the magnetic sensor device 2 according to the present example embodiment will be described. The manufacturing method for the magnetic sensor device 2 includes a step of producing a plurality of magnetic sensors 4 and a step of fabricating a plurality of magnetic sensor devices 2 by using the plurality of magnetic sensors 4.

Figure 14:
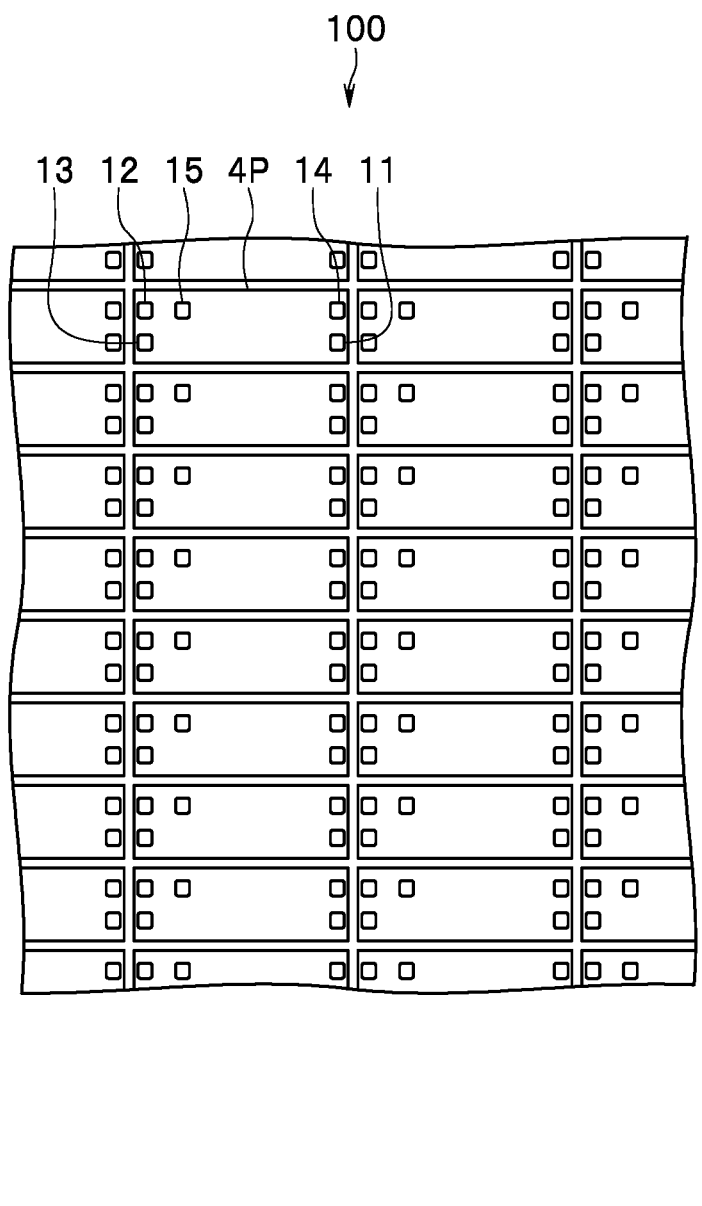
FIG. 14 is a plan view showing a foundation structure of the first example embodiment of the technology.

First, the step of producing the plurality of magnetic sensors 4 will be described. In the step of producing the plurality of magnetic sensors 4, first, components other than the substrates 10 of the plurality of magnetic sensors 4 are formed on a wafer including parts to be the substrates 10 of the plurality of magnetic sensors 4, to produce a foundation structure 100 in which initial magnetic sensors 4P to later become the magnetic sensors 4 are arranged in a plurality of lines. FIG. 14 is a plan view showing part of the top surface of a stack in the step of producing the foundation structure 100.

Next, by cutting this foundation structure 100, the plurality of initial magnetic sensors 4P are separated from each other. In this way, the plurality of magnetic sensors 4 are produced.

Here, by focusing on one initial magnetic sensor 4P, the step of producing the foundation structure 100 will be described in more detail. The step of producing the foundation structure 100 includes a step of forming the plurality of MR elements 50 on the substrate 10, a step of forming the pads 11 to 14 and the sub-pad 15 on the substrate 10, and a step of forming a plurality of wirings connected to the plurality of MR elements 50, the pads 11 to 14, and the sub-pad 15.

In the step of forming the plurality of MR elements 50, a plurality of initial MR elements to later become the plurality of MR elements 50 are initially formed. Each of the plurality of initial MR elements includes an initial magnetization pinned layer to later become the magnetization pinned layer 51, the free layer 53, and the gap layer 52.

Next, the magnetization directions of the initial magnetization pinned layers are fixed to predetermined directions using laser light and external magnetic fields in the foregoing predetermined directions. For example, a plurality of initial MR elements to later become the plurality of MR elements 50 constituting the resistors R11, R22, R32, and R41 are irradiated with laser light while an external magnetic field in the first magnetization direction (−X direction) is applied thereto. When the irradiation with the laser light is completed, the magnetization directions of the initial magnetization pinned layers are fixed to the first magnetization direction. This makes the initial magnetization pinned layers into the magnetization pinned layers 51, and the plurality of initial MR elements into the plurality of MR elements 50 constituting the resistors R11, R22, R32, and R41.

In a plurality of other initial MR elements to later become the plurality of MR elements 50 constituting the resistors R12, R21, R31, and R42, the magnetization direction of the initial magnetization pinned layer in each of the plurality of other initial MR elements can be fixed to the second magnetization direction (X direction) by setting the direction of the external magnetic field to the second magnetization direction. The plurality of MR elements 50 are formed in such a manner.

Next, the step of fabricating the plurality of magnetic sensor devices 2 will be described. In the step of fabricating the plurality of magnetic sensor devices 2, a lead frame structure in which a plurality of lead frames are aligned in a grid is used. Each of the plurality of lead frames includes the die pad 60, leads 61 to 64, and the sub-leads 71 to 76 to be used for one magnetic sensor 4. The leads 61 to 64 and the sub-leads 71 to 76 are connected to a frame member of the lead frame structure.

Here, one lead frame is focused. In the step of fabricating the plurality of magnetic sensor devices 2, first, the magnetic sensor 4 is placed on the die pad 60 of the lead frame. Next, by the bonding wires 82, the pads 11 to 14 and the leads 61 to 64 of the magnetic sensor 4 are connected, and also the sub-pad 15 and the sub-lead 72 of the magnetic sensor 4 are connected. Next, the magnetic sensor 4 is sealed by a sealing resin.

In the step of fabricating the plurality of magnetic sensor devices 2, a structure in which the plurality of magnetic sensors 4 are sealed by the sealing resin is fabricated. By cutting this structure, the plurality of magnetic sensor devices 2 are produced. The frame member of the lead frame structure is removed in a step of cutting the structure.

Next, the operation and effects of the magnetic encoder 1 and the magnetic sensor device 2 according to the present example embodiment will be described. In the present example embodiment, the magnetic sensor 4 is configured to detect the magnetic field component MFx of the target magnetic field MF generated by the magnetic field generator 3. The strength of the magnetic field component MFx changes with the position in the direction parallel to the X direction. In particular, in the present example embodiment, each of the arms R1 to R4 of the bridge circuit 4A of the magnetic sensor 4 is configured to have sensitivity to the magnetic field component MFx. Concretely, the two resistors included in each of the arms R1 to R4 are configured to satisfy the above-described plurality of requirements.

However, when the two resistors included in each of the arms R1 to R4 are configured to satisfy the above-described plurality of requirements, each of the arms R1 to R4 does not have sensitivity to a uniform external magnetic field. For example, when the direction of the uniform external magnetic field is the direction obtained by rotating an angle from the X direction toward the Y direction, the angle being more than 0° and less than 90°, the resistance of the resistor R31 of the arm R3 decreases while the resistance of the resistor R32 of the arm R3 increases. As a result, the resistance of the arm R3 does not change or changes little. Similarly, the resistance of each of the arms R1, R2, and R4 does not change or changes little.

As described above, even when the uniform external magnetic field is applied to the magnetic sensor 4, the resistance of each of the arms R1 to R4 does not change or changes little. Hence, even when the uniform external magnetic field is applied to the magnetic sensor 4, the resistance between the pad 11 (power supply port) and the pad 13 (signal port), the resistance between the pad 12 (ground port) and the pad 13 (signal port), the resistance between the pad 11 (power supply port) and the pad 14 (signal port), and the resistance between the pad 12 (ground port) and the pad 14 (signal port) do not change or change little. Moreover, even when the pad 11 (power supply port) is connected to a power supply in a state where the uniform external magnetic field is applied to the magnetic sensor 4, the potential at each of the pads 13 and 14 (signal ports) does not change or changes little.

As described above, since each of the arms R1 to R4 does not have sensitivity to the uniform external magnetic field, the magnetic sensor 4 cannot be inspected by a method of measuring a resistance between two pads or a method of measuring a potential at each of the pads 13 and 14, when the uniform external magnetic field is used as a magnetic field for inspection.

In contrast to this, in the present example embodiment, the magnetic sensor 4 includes the sub-pad 15. The sub-pad 15 is electrically connected between one end and the other end of the arm R3. In particular, in the present example embodiment, the sub-pad 15 is connected to the connection point of the resistors R31 and R32. The resistance of the resistor R31 changes with the strength and direction of the uniform external magnetic field. Consequently, the resistance between the pad 11 and the sub-pad 15 also changes with the strength and direction of the uniform external magnetic field. The resistance of the resistor R32 also changes with the strength and direction of the uniform external magnetic field. Consequently, the resistance between the pad 12 and the sub-pad 15 and the resistance between the pad 14 and the sub-pad 15 change with the strength and direction of the uniform external magnetic field. When the pad 11 (power supply port) is connected to the power supply, the potential at the sub-pad 15 also changes with the strength and direction of the uniform external magnetic field. Hence, according to the present example embodiment, even when the uniform external magnetic field is used as the magnetic field for inspection, the magnetic sensor 4 can be inspected by a method of measuring a resistance by using the sub-pad 15 or a method of measuring a potential at the sub-pad 15.

In the present example embodiment, the sub-pad 15 is electrically connected to the die pad 60. Hence, according to the present example embodiment, by bringing a probe for inspection into contact with the die pad 60, the magnetic sensor 4 can be inspected.

Note that, in the present example embodiment, also by bringing the probe for inspection into direct contact with the sub-pad 15, the magnetic sensor 4 can be inspected. Hence, according to the present example embodiment, also by applying a uniform external magnetic field to the foundation structure 100 shown in FIG. 14, the magnetic sensor 4 (initial magnetic sensor 4P) can be inspected.

Moreover, in the present example embodiment, no lead for connecting to the sub-pad 15 need be added. Hence, according to the present example embodiment, the magnetic sensor device 2 can be miniaturized.

Note that, in the present example embodiment, no pad is electrically connected between one end and another end of the arm R1, between one end and another end of the arm R2, and between one end and another end of the arm R4.

Modification Examples

Figure 15:
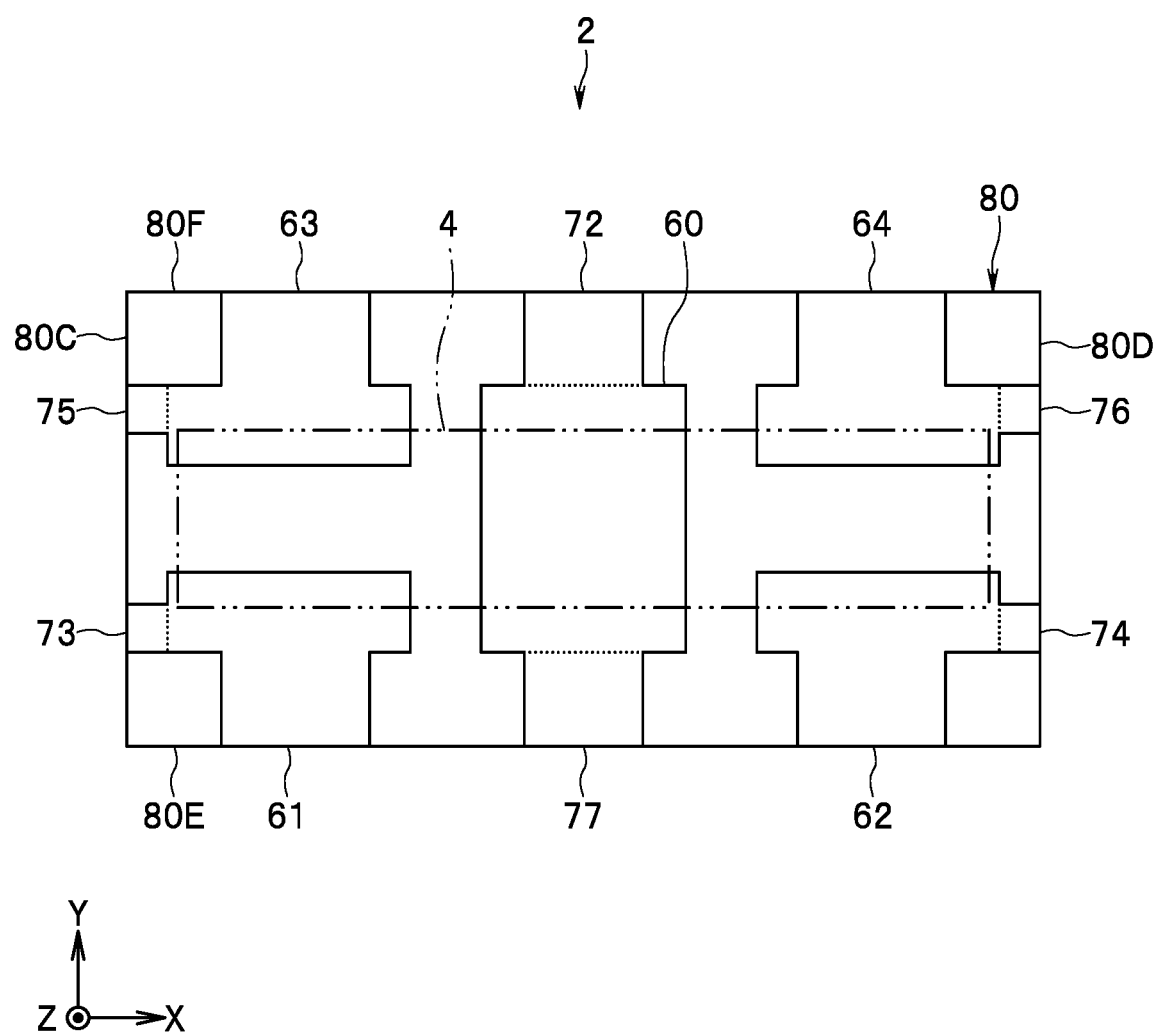
FIG. 15 is a plan view showing a first modification example of the magnetic sensor device according to the first example embodiment of the technology.

Next, first and second modification examples of the magnetic sensor device 2 according to the present example embodiment will be described. First, the first modification example will be described with reference to FIG. 15. FIG. 15 is a plan view showing the first modification example of the magnetic sensor device 2. In the first modification example, the magnetic sensor device 2 includes a sub-lead 77 connected to the die pad 60, instead of the sub-lead 71 shown in FIGS. 3 to 6. In FIG. 15, a border between the die pad 60 and the sub-lead 77 is shown by a dotted line. The sub-lead 77 is exposed at the side surface 80E. The dimension of the sub-lead 77 in the direction parallel to the X direction is the same as or substantially the same as the dimension of the sub-lead 72 in the direction parallel to the X direction.

Figure 16:
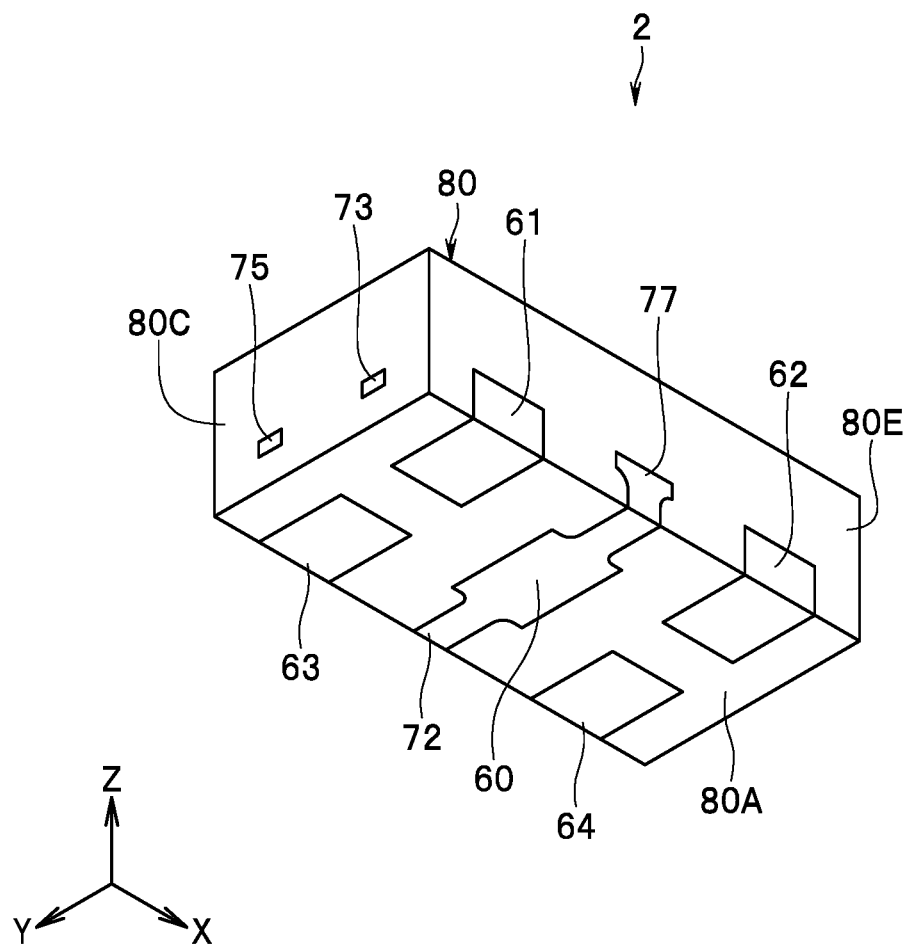
FIG. 16 is a perspective view showing a second modification example of the magnetic sensor device according to the first example embodiment of the technology.

Next, the second modification example will be described with reference to FIG. 16. FIG. 16 is a perspective view showing the second modification example of the magnetic sensor device 2. The second modification example is different from the first modification example in the following respect. In the second modification example, the sub-leads 72 and 77 are exposed at the bottom surface 80A of the body 80 of the magnetic sensor device 2.

Second Example Embodiment

Next, a second example embodiment of the technology will be described. A magnetic sensor device 2 according to the present example embodiment includes a magnetic sensor 104 instead of the magnetic sensor 4 of the first example embodiment.

Figure 17:
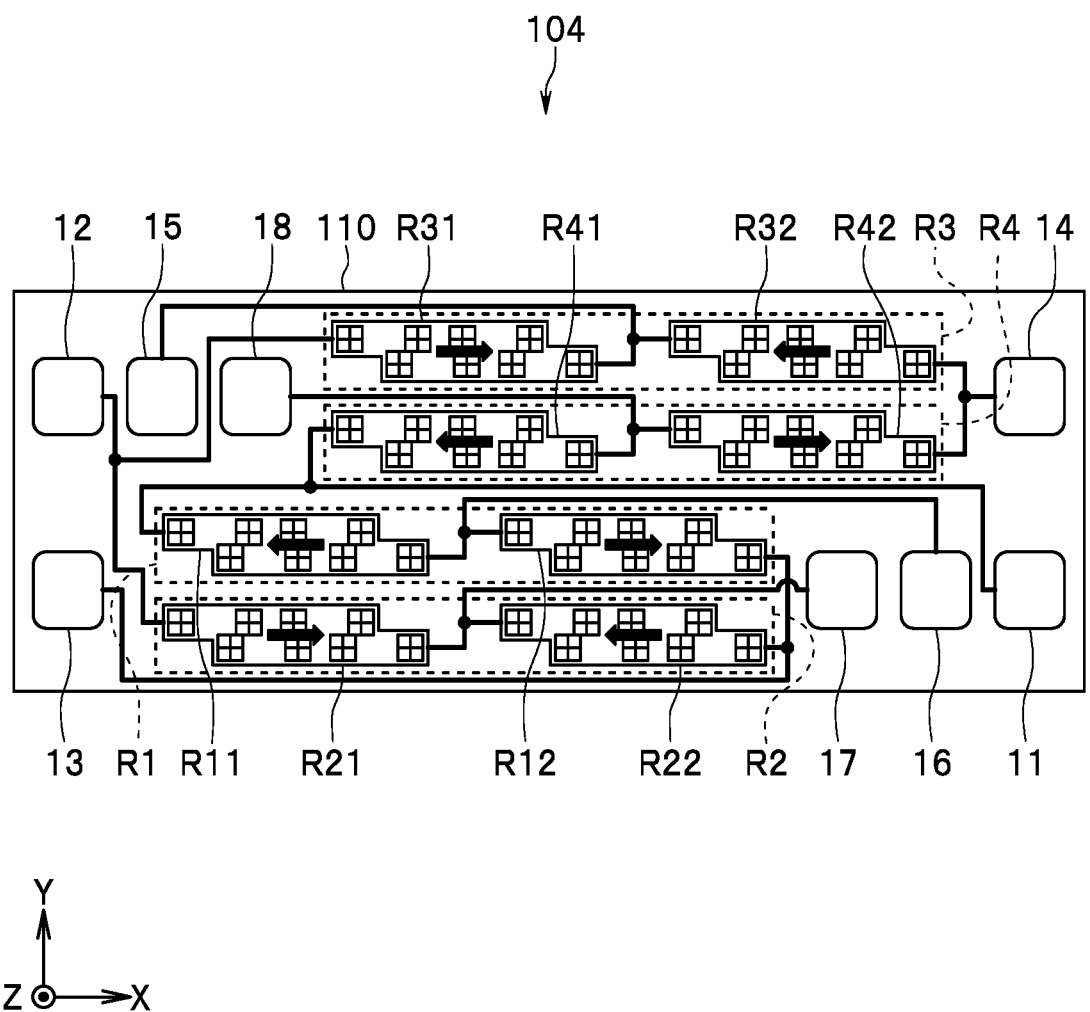
FIG. 17 is a plan view showing a magnetic sensor of a second example embodiment of the technology.
Figure 18:
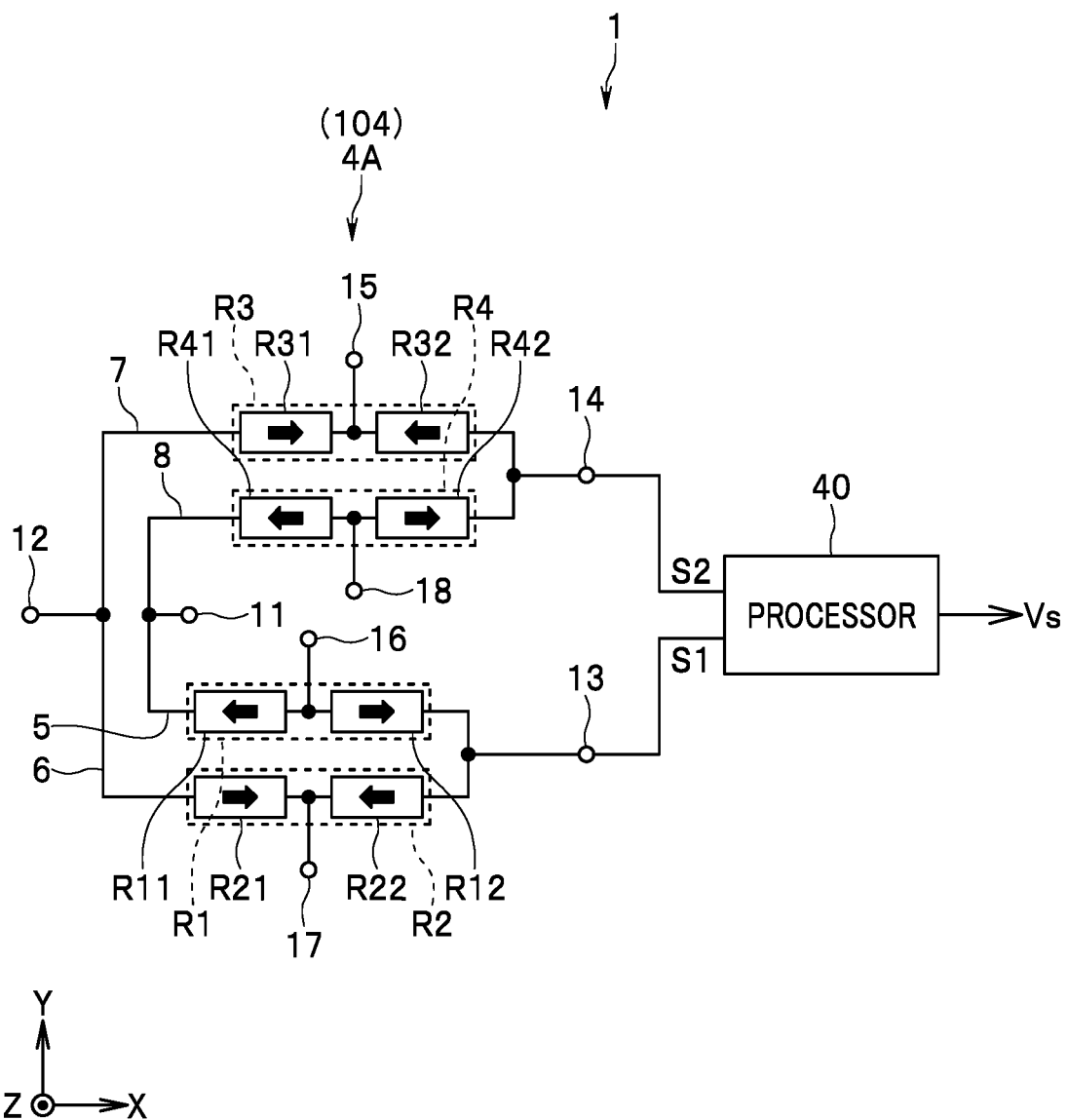
FIG. 18 is a circuit diagram showing a configuration of the magnetic sensor of the second example embodiment of the technology.

FIG. 17 is a plan view showing the magnetic sensor 104 of the present example embodiment. FIG. 18 is a circuit diagram showing the configuration of the magnetic sensor 104 of the present example embodiment. The configuration of the magnetic sensor 104 is basically the same as the configuration of the magnetic sensor 4 of the first example embodiment. Specifically, the magnetic sensor 104 includes a bridge circuit 4A including the arms R1 to R4, the pads 11 to 14, and the sub-pad 15.

The magnetic sensor 104 further includes three sub-pads 16, 17, and 18. The sub-pad 16 is electrically connected between one end and the other end of the arm R1. The sub-pad 17 is electrically connected between one end and the other end of the arm R2. The sub-pad 18 is electrically connected between one end and the other end of the arm R4.

In particular, in the present example embodiment, the sub-pad 16 is connected to the connection point of the resistors R11 and R12 of the arm R1. The sub-pad 17 is connected to the connection point of the resistors R21 and R22 of the arm R2. The sub-pad 18 is connected to the connection point of the resistors R41 and R42 of the arm R4.

Figure 19:
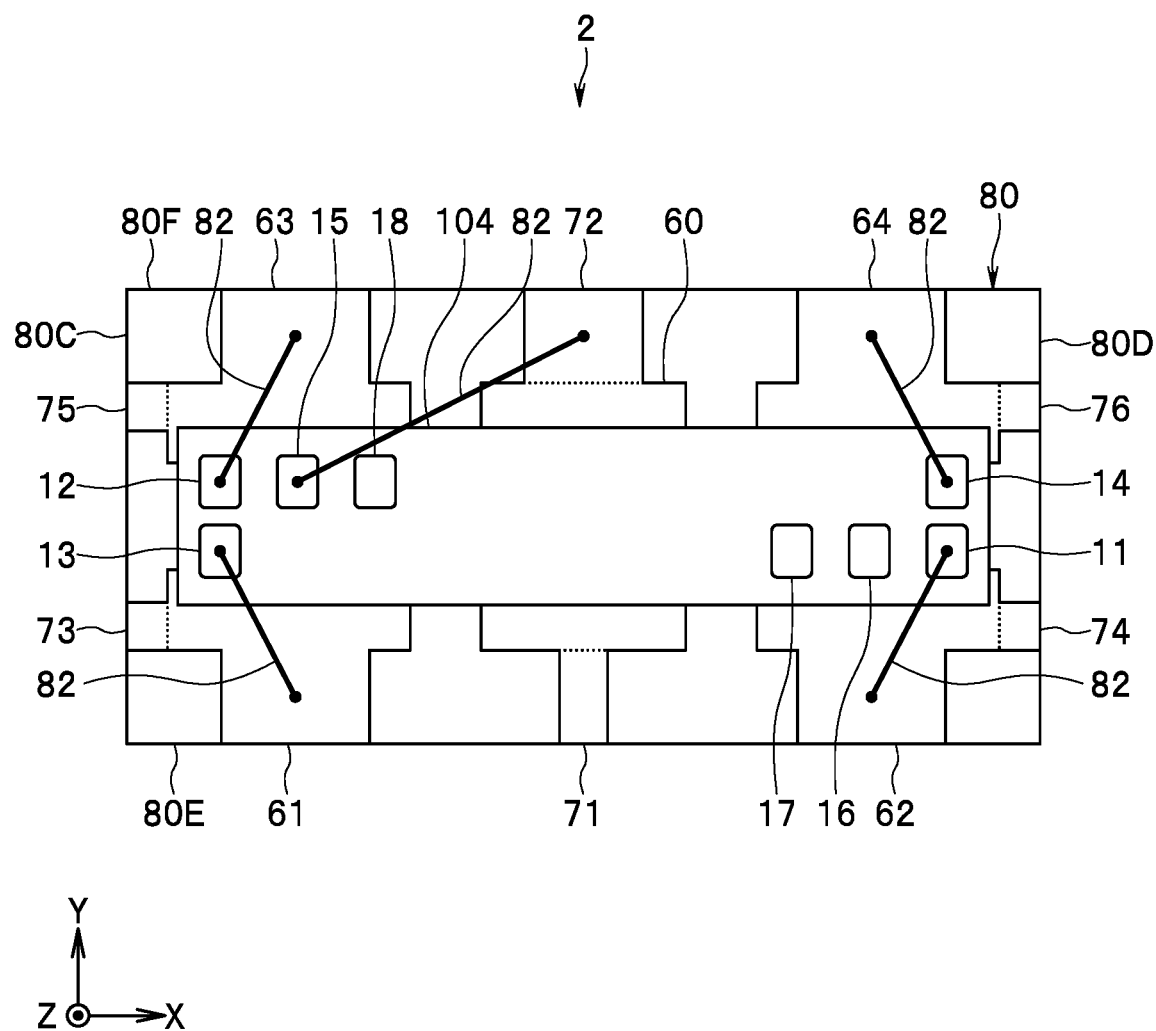
FIG. 19 is an explanatory diagram for describing a connection relationship between a die pad and a plurality of leads and the magnetic sensor of the second example embodiment of the technology.

Next, a connection relationship between the magnetic sensor 104 and the leads 61 to 64 and the die pad 60 of the magnetic sensor device 2 will be described with reference to FIG. 19. FIG. 19 is an explanatory diagram for describing the connection relationship. The connection relationship between the pads 11 to 14 and the leads 61 to 64 of the magnetic sensor 104 is the same as that of the first example embodiment.

In the present example embodiment, one pad of the sub-pads 15 to 18 is electrically connected to the die pad 60. In the example shown in FIG. 19, the sub-pad 15 is electrically connected to the die pad 60 by the bonding wire 82 and the sub-lead 72. However, one pad of the sub-pads 16 to 18, instead of the sub-pad 15, may be electrically connected to the die pad 60.

According to the present example embodiment, even when the uniform external magnetic field is used as the magnetic field for inspection, the magnetic sensor 104 can be inspected by a method of measuring a resistance by using the sub-pads 15 to 18 or a method of measuring a potential at one of the sub-pads 15 to 18. Note that, in a manufacturing procedure for the magnetic sensor device 2, the magnetic sensor 104 can be inspected by using a sub-pad other than the sub-pad connected to the die pad 60 as long as being in a state before the magnetic sensor 104 is sealed by a sealing resin. After the magnetic sensor device 2 is completed, the magnetic sensor 104 can be inspected by using the die pad 60.

The configuration, operation and effects of the present example embodiment are otherwise the same as those of the first example embodiment.

Third Example Embodiment

Figure 20:
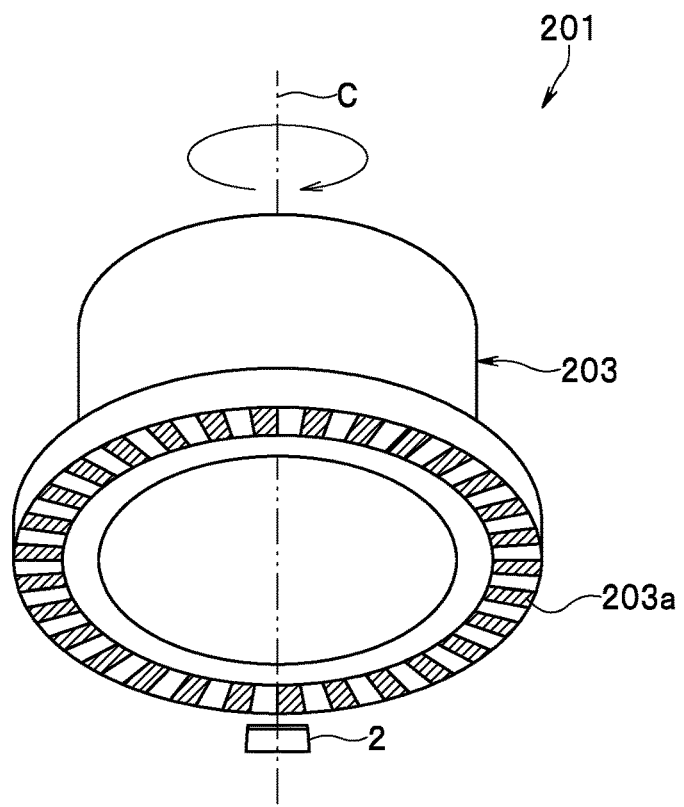
FIG. 20 is a perspective view showing a magnetic encoder according to a third example embodiment of the technology.
Figure 21:
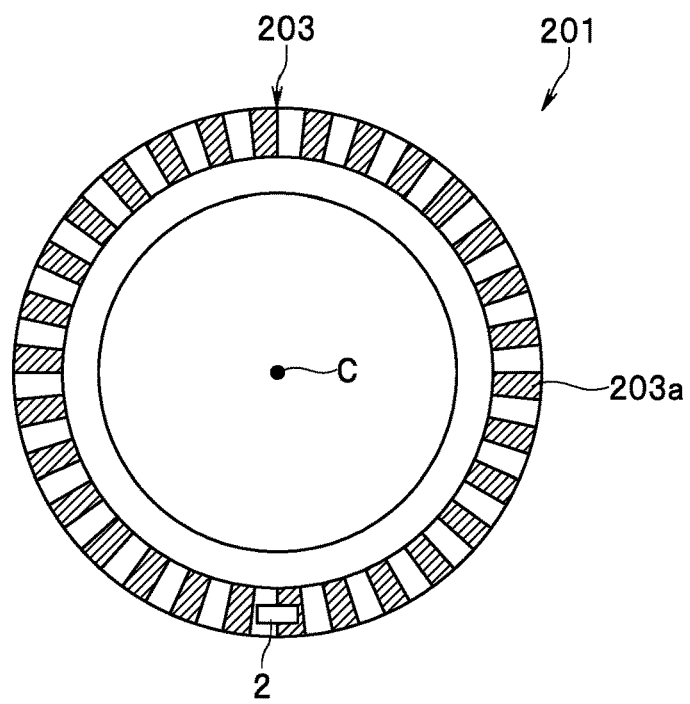
FIG. 21 is a plan view showing the magnetic encoder according to the third example embodiment of the technology.

Next, a magnetic encoder according to the present example embodiment will be described with reference to FIGS. 20 and 21. FIG. 20 is a perspective view showing the magnetic encoder according to the present example embodiment. FIG. 21 is a plan view showing the magnetic encoder according to the present example embodiment.

A magnetic encoder 201 according to the present example embodiment includes the magnetic sensor device 2 described in the first example embodiment and a magnetic field generator 203. The magnetic field generator 203 is configured to rotate about a predetermined rotation axis C.

The magnetic field generator 203 is a magnetic scale (rotation scale) including a plurality of pairs of N and S poles alternately arranged around the rotation axis C. The magnetic field generator 203 includes an end surface 203a located at an end in one direction parallel to the rotation axis C. The plurality of pairs of N and S poles are provided on the end surface 203a. In FIGS. 20 and 21, for ease of understanding, the N poles are shown with hatching. The magnetic sensor device 2 is located so as to face the end surface 203a. The strength of the magnetic field component MFx (see FIG. 2) in a reference position, for example, a position in which the magnetic sensor device 2 is located, changes with rotation of the magnetic field generator 203.

In the present example embodiment, two directions orthogonal to the rotation axis C may be the X direction and the Y direction, and a direction parallel to the rotation axis C and directed from the magnetic sensor device 2 to the magnetic field generator 203 may be the Z direction. The Y direction may be a direction directed from the rotation axis C to the magnetic sensor device 2.

The magnetic encoder 201 further includes the processor 40 described in the first example embodiment (see FIG. 8). The magnetic encoder 201 generates the detection value Vs having a correspondence with the rotation position of the magnetic field generator 203 on the basis of the first and second detection signals S1 and S2 generated by the magnetic sensor 4 of the magnetic sensor device 2 (see FIG. 8).

The configuration, operation and effects of the present example embodiment are otherwise the same as those of the first example embodiment.

The technology is not limited to the foregoing example embodiments, and various modifications may be made thereto. For example, the number and layout of the MR elements 50 are not limited to the examples described in the example embodiments but may be freely set as long as the requirements set forth in the claims are satisfied.

The portion of the arm R3 to which the sub-pad 15 is connected is not limited to the connection point of the resistors R31 and R32. For example, consider that the resistor R31 or the resistor R32 is divided into two resistor parts connected in series. In this case, the sub-pad 15 may be electrically connected to the connection point of the two resistor parts.

The magnetic sensor 4 of the first example embodiment may include one of the sub-pads 16 to 18 of the second example embodiment instead of the sub-pad 15.

The magnetic sensor device 2 may include any support supporting the magnetic sensor 4 or 104, instead of the die pad 60 or in addition to the die pad 60. The support may be formed of a conductive material or may be formed of an insulating material.

As described above, a magnetic sensor device according to one embodiment of the technology includes a magnetic sensor configured to detect a target magnetic field including a magnetic field component in a first direction, a die pad supporting the magnetic sensor, and a plurality of leads. The magnetic sensor includes a bridge circuit including a plurality of arms and a plurality of pads electrically connected to the bridge circuit, the plurality of arms being each constituted of a plurality of magnetic detection elements and also configured such that a resistance changes according to change of strength of the magnetic field component. Each of the plurality of arms is configured to have sensitivity to a magnetic field component with strength changing according to a position in a first direction while not having sensitivity to an external magnetic field with strength and a direction being the same irrespective of the position in the first direction.

Each of the plurality of pads is electrically connected to a corresponding one of the plurality of leads. The plurality of pads include a first pad, a second pad, and a third pad. The plurality of arms include a first arm provided between the first pad and the second pad in circuit configuration and a second arm provided between the second pad and the third pad in circuit configuration. The magnetic sensor further includes a first sub-pad electrically connected between one end and another end of the first arm and also electrically connected to the die pad.

In the magnetic sensor device according to one embodiment of the technology, one of the first pad and the third pad may constitute a power supply port of the magnetic sensor. The other of the first pad and the third pad may constitute a ground port of the magnetic sensor. The second pad may constitute a signal port of the magnetic sensor.

In the magnetic sensor device according to one embodiment of the technology, the first sub-pad need not necessarily be electrically connected to an external circuit in a state where the magnetic sensor device is mounted on a mount.

In the magnetic sensor device according to one embodiment of the technology, no pad may be electrically connected between one end and another end of the second arm. Alternatively, the magnetic sensor may further include a second sub-pad electrically connected between one end and the other end of the second arm. The second sub-pad need not necessarily be electrically connected to the plurality of leads and the die pad.

In the magnetic sensor device according to one embodiment of the technology, the plurality of pads may further include a fourth pad. The plurality of arms may further include a third arm provided between the third pad and the fourth pad in circuit configuration and a fourth arm provided between the first pad and the fourth pad in circuit configuration. No pad may be electrically connected between one end and the other end of the second arm, between one end and another end of the third arm, and between one end and another end of the fourth arm. Alternatively, the magnetic sensor may further include a second sub-pad electrically connected between the one end and the other end of the second arm, a third sub-pad electrically connected between one end and the other end of the third arm, and a fourth sub-pad electrically connected between one end and the other end of the fourth arm. The second sub-pad, the third sub-pad, and the fourth sub-pad need not necessarily be electrically connected to the plurality of leads and the die pad. The number of the plurality of leads may be four.

In the magnetic sensor device according to one embodiment of the technology, the plurality of arms may be configured such that the resistance of each of the plurality of arms changes in a different phase according to periodic change of the strength of the magnetic field component. In this case, each of the plurality of arms may include two resistors connected in series. In each of the plurality of arms, the two resistors may be configured such that the resistances of the two respective resistors change in the same phase according to periodic change of the strength of the magnetic field component and configured such that the resistances of the two respective resistors change in opposite phases according to periodic change of the strength or the direction of the external magnetic field. The first sub-pad may be electrically connected to the connection point of the two resistors of the first arm.

In the magnetic sensor device according to one embodiment of the technology, the plurality of magnetic detection elements may be a plurality of magnetoresistive elements. Each of the plurality of magnetoresistive elements may include a magnetization pinned layer having a first magnetization whose direction is fixed, a free layer having a second magnetization whose direction is variable, and a gap layer arranged between the magnetization pinned layer and the free layer. In this case, each of the plurality of arms may include two resistors connected in series. The first magnetization of the magnetization pinned layer in each of the plurality of magnetoresistive elements in one of the two resistors may contain a component in a first magnetization direction. The second magnetization of the magnetization pinned layer in each of the plurality of magnetoresistive elements in the other of the two resistors may contain a component in a second magnetization direction opposite to the first magnetization direction. The first sub-pad may be electrically connected to the connection point of the two resistors of the first arm.

A magnetic encoder according to one embodiment of the technology includes the magnetic sensor device according to one embodiment of the technology and a magnetic field generator configured to generate a target magnetic field. The magnetic sensor and the magnetic field generator are configured such that the strength of the magnetic field component in a reference position changes when at least one of the magnetic sensor and the magnetic field generator operates.

In the magnetic encoder according to one embodiment of the technology, the magnetic field generator may be a magnetic scale including a plurality of pairs of N and S poles alternately arranged in the first direction. Alternatively, the magnetic field generator may be a magnetic scale including a plurality of pairs of N and S poles alternately arranged around a rotation axis.

Obviously, many modifications and variations of the technology are possible in the light of the above teachings. Thus, it is to be understood that, within the scope of the appended claims and equivalents thereof, the technology may be practiced in other example embodiments than the foregoing example embodiments.

What is claimed is:

1. A magnetic sensor device comprising:
 a magnetic sensor configured to detect a target magnetic field including a magnetic field component in a first direction;
 a die pad supporting the magnetic sensor; and
 a plurality of leads, wherein
 the magnetic sensor includes a bridge circuit including a plurality of arms and a plurality of pads electrically connected to the bridge circuit, the plurality of arms being each constituted of a plurality of magnetic detection elements and configured such that a resistance changes according to change of strength of the magnetic field component,
 each of the plurality of arms is configured to have sensitivity to the magnetic field component with strength changing according to a position in the first direction while not having sensitivity to an external magnetic field with strength and a direction being same irrespective of the position in the first direction,
 each of the plurality of pads is electrically connected to one corresponding lead among the plurality of leads,
 the plurality of pads include a first pad, a second pad, and a third pad,
 the plurality of arms include a first arm provided between the first pad and the second pad in circuit configuration and a second arm provided between the second pad and the third pad in circuit configuration, and
 the magnetic sensor further includes a first sub-pad electrically connected between one end and another end of the first arm and electrically connected to the die pad.

2. The magnetic sensor device according to claim 1, wherein
 one of the first pad and the third pad constitutes a power supply port of the magnetic sensor,
 another one of the first pad and the third pad constitutes a ground port of the magnetic sensor, and
 the second pad constitutes a signal port of the magnetic sensor.

3. The magnetic sensor device according to claim 1, wherein the first sub-pad is not electrically connected to an external circuit in a state where the magnetic sensor device is mounted on a mount.

4. The magnetic sensor device according to claim 1, wherein no pad is electrically connected between one end and another end of the second arm.

5. The magnetic sensor device according to claim 1, wherein the magnetic sensor further includes a second sub-pad electrically connected between one end and another end of the second arm.

6. The magnetic sensor device according to claim 5, wherein the second sub-pad is not electrically connected to the plurality of leads and the die pad.

7. The magnetic sensor device according to claim 1, wherein
the plurality of pads further includes a fourth pad, and
the plurality of arms further includes a third arm provided between the third pad and the fourth pad in circuit configuration and a fourth arm provided between the first pad and the fourth pad in circuit configuration.

8. The magnetic sensor device according to claim 7, wherein no pad is electrically connected between one end and another end of the second arm, between one end and another end of the third arm, and between one end and another end of the fourth arm.

9. The magnetic sensor device according to claim 7, wherein the magnetic sensor further includes a second sub-pad electrically connected between one end and another end of the second arm, a third sub-pad electrically connected between one end and another end of the third arm, and a fourth sub-pad electrically connected between one end and another end of the fourth arm.

10. The magnetic sensor device according to claim 9, wherein the second sub-pad, the third sub-pad, and the fourth sub-pad are not electrically connected to the plurality of leads and the die pad.

11. The magnetic sensor device according to claim 7, wherein the number of the plurality of leads is four.

12. The magnetic sensor device according to claim 1, wherein the plurality of arms are configured such that the resistance of each of the plurality of arms changes in a different phase according to periodic change of the strength of the magnetic field component.

13. The magnetic sensor device according to claim 12, wherein
each of the plurality of arms includes two resistors connected in series, and
in each of the plurality of arms, the two resistors are configured such that the resistances of the two respective resistors change in a same phase according to periodic change of the strength of the magnetic field component and configured such that the resistances of the two respective resistors change in opposite phases according to periodic change of the strength or the direction of the external magnetic field.

14. The magnetic sensor device according to claim 13, wherein the first sub-pad is electrically connected to a connection point of the two resistors of the first arm.

15. The magnetic sensor device according to claim 1, wherein
the plurality of magnetic detection elements are a plurality of magnetoresistive elements, and
each of the plurality of magnetoresistive elements includes a magnetization pinned layer having a first magnetization whose direction is fixed, a free layer having a second magnetization whose direction is variable, and a gap layer arranged between the magnetization pinned layer and the free layer.

16. The magnetic sensor device according to claim 15, wherein
each of the plurality of arms includes two resistors connected in series,
the first magnetization of the magnetization pinned layer of each of the plurality of magnetoresistive elements in one of the two resistors includes a component in a first magnetization direction, and
the second magnetization of the magnetization pinned layer of each of the plurality of magnetoresistive elements in another of the two resistors includes a component in a second magnetization direction opposite to the first magnetization direction.

17. The magnetic sensor device according to claim 16, wherein the first sub-pad is electrically connected to a connection point of the two resistors of the first arm.

18. A magnetic encoder comprising:
the magnetic sensor device according to claim 1; and
a magnetic field generator configured to generate the target magnetic field, wherein
the magnetic sensor and the magnetic field generator are configured such that the strength of the magnetic field component in a reference position changes when at least one of the magnetic sensor and the magnetic field generator operates.

19. The magnetic encoder according to claim 18, wherein the magnetic field generator is a magnetic scale including a plurality of pairs of N and S poles alternately arranged in the first direction.

20. The magnetic encoder according to claim 18, wherein the magnetic field generator is a magnetic scale including a plurality of pairs of N and S poles alternately arranged around a rotation axis.

* * * * *